United States Patent
Hinode et al.

(10) Patent No.: US 12,080,566 B2
(45) Date of Patent: Sep. 3, 2024

(54) SUBSTRATE TREATING APPARATUS AND SUBSTRATE TREATING METHOD

(71) Applicant: SCREEN Holdings Co., Ltd., Kyoto (JP)

(72) Inventors: Taiki Hinode, Kyoto (JP); Takashi Ota, Kyoto (JP); Mitsukazu Takahashi, Kyoto (JP); Kazuhiro Honsho, Kyoto (JP); Yusuke Akizuki, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 249 days.

(21) Appl. No.: 17/640,858

(22) PCT Filed: May 25, 2020

(86) PCT No.: PCT/JP2020/020548
§ 371 (c)(1),
(2) Date: Mar. 7, 2022

(87) PCT Pub. No.: WO2021/053885
PCT Pub. Date: Mar. 25, 2021

(65) Prior Publication Data
US 2022/0344176 A1    Oct. 27, 2022

(30) Foreign Application Priority Data

Sep. 20, 2019   (JP) .................................. 2019-171511

(51) Int. Cl.
*H01L 21/67* (2006.01)
*B05C 5/02* (2006.01)
(Continued)

(52) U.S. Cl.
CPC .......... *H01L 21/67023* (2013.01); *B05C 5/02* (2013.01); *B05C 11/08* (2013.01);
(Continued)

(58) Field of Classification Search
CPC ................................................ H01L 21/67023
See application file for complete search history.

(56) References Cited

U.S. PATENT DOCUMENTS

| 2006/0222315 | A1 | 10/2006 | Yoshida ......................... 385/147 |
| 2015/0056783 | A1 | 2/2015 | Kerdiles et al. .............. 438/457 |
| 2018/0221925 | A1* | 8/2018 | Ito ..................... H01L 21/67051 |

FOREIGN PATENT DOCUMENTS

| JP | H11-087294 A | 3/1999 |
| JP | 2006-060252 A | 3/2006 |

(Continued)

OTHER PUBLICATIONS

Notice of Allowance dated Oct. 11, 2023 for corresponding Korean Patent Application No. 10-2022-7008922.
(Continued)

*Primary Examiner* — Jason Y Ko
(74) *Attorney, Agent, or Firm* — OSTROLENK FABER LLP

(57) ABSTRACT

A substrate treating apparatus and a substrate treating method. The substrate treating apparatus includes a treating unit and a controller. The treating unit includes a substrate holder, a rotation driving unit, a treatment liquid supplying unit, a liquid collecting unit, and a guard driving unit. The substrate holder holds a substrate in a horizontal posture. The rotation driving unit rotates the substrate holder. The liquid collecting unit includes a first guard, a second guard, and a liquid inlet. The first guard and the second guard are arranged so as to surround the substrate holder laterally. The liquid inlet is defined by the guards. The liquid inlet is open toward the substrate held by the substrate holder. The guard driving unit moves the second guard in a vertical direction. The controller controls the guard driving unit in accordance with the shape of the substrate held by the substrate holder, thereby changing a height position of an upper end of the liquid inlet.

14 Claims, 14 Drawing Sheets

(51) Int. Cl.
  *B05C 11/08*   (2006.01)
  *B05C 11/10*   (2006.01)
  *H01L 21/68*   (2006.01)
(52) U.S. Cl.
  CPC .... *B05C 11/1039* (2013.01); *H01L 21/67242* (2013.01); *H01L 21/68* (2013.01)

(56) References Cited

FOREIGN PATENT DOCUMENTS

| JP | 2006-286833 A | 10/2006 |
| JP | 2009-110985 A | 5/2009 |
| JP | 2015-177014 A | 10/2015 |
| KR | 20190042854 A * | 4/2019 |

OTHER PUBLICATIONS

International Search Report mailed Jul. 28, 2020 in corresponding PCT International Application No. PCT/JP2020/020548.
Written Opinion mailed Jul. 28, 2020 in corresponding PCT International Application No. PCT/JP2020/020548.

* cited by examiner

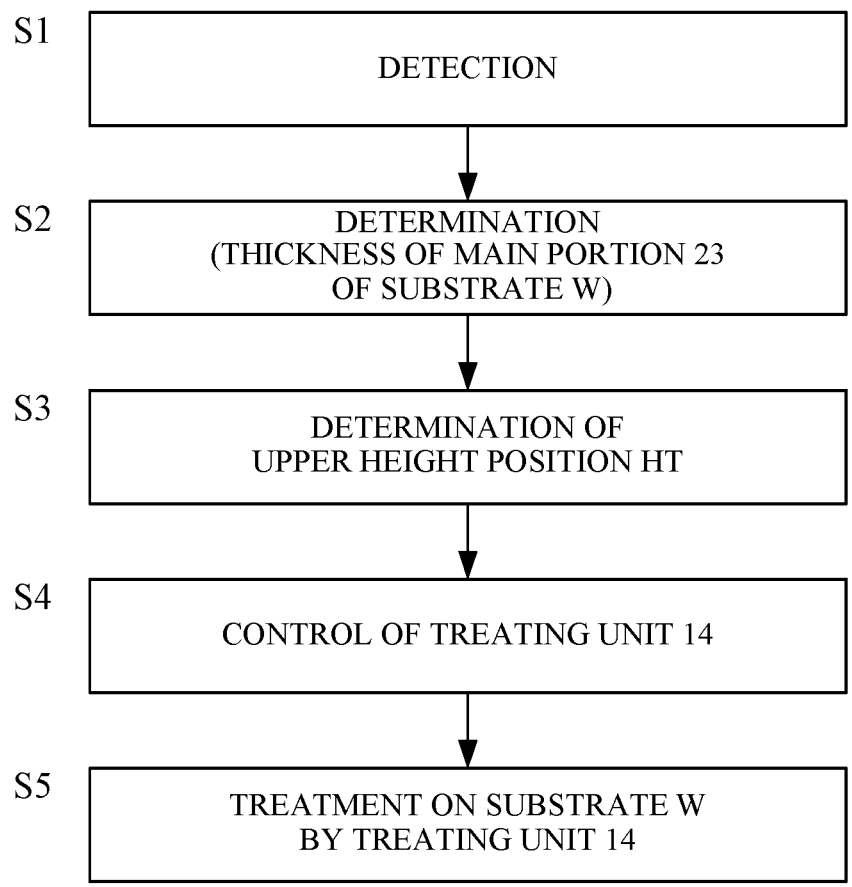

SUBSTRATE TREATING APPARATUS AND SUBSTRATE TREATING METHOD

CROSS-REFERENCE TO RELATED APPLICATIONS

The present application is a 35 U.S.C. §§ 371 national phase conversion of International Application No. PCT/JP2020/020548, filed May 25, 2020, which claims priority to Japanese Patent Application No. 2019-171511, filed Sep. 20, 2019, the contents of both of which are incorporated herein by reference. The PCT International Application was published in the Japanese language.

TECHNICAL FIELD

The present invention relates to a substrate treating apparatus and a substrate treating method for treating substrates. Examples of the substrates include a semiconductor wafer, a substrate for liquid crystal display, a substrate for organic electroluminescence (EL), a substrate for flat panel display (FPD), a substrate for optical display, a magnetic disk substrate, an optical disk substrate, a magneto-optical disk substrate, a substrate for photomask, and a solar cell substrate.

BACKGROUND ART

Patent Literature 1 discloses a substrate treating apparatus. Hereinunder, numerals in the Patent Literature 1 are expressed in parentheses. The substrate treating apparatus includes a spin chuck (41), a first cup (10), a second cup (20), and a third cup (30). The spin chuck (41) holds a semiconductor wafer (100). The spin chuck (41) is rotatable. The first cup (10), the second cup (20), and the third cup (30) each receive a treatment liquid scattered from the semiconductor wafer (100). The first cup (10), the second cup (20), and the third cup (30) are each movable in a vertical direction.

The substrate treating apparatus includes a head (60), a nozzle (82), and a nozzle (84). The head (60) supplies a sulfuric acid hydrogen peroxide mixture to the semiconductor wafer (100). The nozzle (82) supplies deionized water to the semiconductor wafer (100). The nozzle (84) supplies a treatment liquid, containing ammonia water and hydrogen peroxide solution, to the semiconductor wafer (100). Hereunder, the sulfuric acid hydrogen peroxide mixture is called "SPM". The treatment liquid containing ammonia water and hydrogen peroxide solution is called "SC1".

The substrate treating apparatus includes a treatment chamber (50). The treatment chamber (50) accommodates the spin chuck (41), the first cup (10), the second cup (20), the third cup (30), the head (60), the nozzle (82), and the nozzle (84).

When the head (60) supplies an SPM to the semiconductor wafer (100), the SPM is received between the first cup (10) and the second cup (20). The first cup (10) is positioned higher than the second cup (20). Specifically, the first cup (10) is located at a first position. When the first cup (10) is located at the first position, an upper end of the first cup (10) contacts a top wall of the treatment chamber (50). The second cup (20) is positioned lower than the semiconductor wafer (100) held by the spin chuck (41).

When the nozzle (84) supplies an SC1 to the semiconductor wafer (100), the SC1 is received between the first cup (10) and the second cup (20). The first cup (10) is positioned higher than the second cup (20). Specifically, the first cup (10) is located at a second position lower than the first position. When the first cup (10) is located at the second position, the upper end of the first cup (10) does not contact the top wall of the treatment chamber (50).

When the nozzle (82) supplies deionized water to the semiconductor wafer (100), the deionized water is received between the second cup (20) and the third cup (30). The second cup (20) is positioned higher than the third cup (30).

PRIOR ART DOCUMENT

Patent Literature

[Patent Literature 1]
Japanese Unexamined Patent Publication No. 2015-177014A

SUMMARY OF INVENTION

Technical Problem

In recent years, substrates have become thinner and larger in diameter. A bending amount of a substrate is remarkably larger as the substrate is thinner and the diameter thereof is larger. Consequently, the currently-used substrate treating apparatus may have difficulty in collecting a treatment liquid appropriately.

The present invention has been made regarding the state of the art noted above, and its one object is to provide a substrate treating apparatus and a substrate treating method that enable suitable treatment of substrates.

Solution to Problem

The present invention is constituted as stated below to achieve the above object. One aspect of the present invention provides a substrate treating apparatus, including:
  a treating unit configured to treat a substrate; and
  a controller configured to control the treating unit,
  the treating unit including:
    a substrate holder configured to hold the substrate in a horizontal posture;
    a rotation driving unit configured to rotate the substrate holder;
    a treatment liquid supplying unit configured to supply a treatment liquid to the substrate held by the substrate holder;
    a liquid collecting unit including two or more guards located so as to surround the substrate holder laterally, and a liquid inlet defined by the guards and open toward the substrate held by the substrate holder; and
    a guard driving unit configured to move at least one or more of the guards in a vertical direction,
  the controller controlling the guard driving unit in accordance with a shape of the substrate held by the substrate holder, thereby changing at least either a height position of an upper end of the liquid inlet or a height position of a lower end of the liquid inlet.

The treating unit includes the substrate holder, the rotation driving unit, the treatment liquid supplying unit, the liquid collecting unit, and the guard driving unit. The substrate holder holds a substrate. The rotation driving unit rotates the substrate holder. Thereby, the substrate held by the substrate holder rotates. The treatment liquid supplying unit supplies a treatment liquid to the substrate held by the substrate holder. The treatment liquid is scattered from the substrate.

The liquid collecting unit collects a treatment liquid scattered from the substrate. The liquid collecting unit includes two or more guards. The guards are each arranged so as to surround the substrate holder laterally. The liquid collecting unit further includes the liquid inlet. The liquid inlet is defined by the guards. The liquid inlet is open toward the substrate held by the substrate holder. The liquid inlet introduces the treatment liquid, scattered from the substrate, into the liquid collecting unit. The guard driving unit moves at least one or more of the guards in the vertical direction. At least one or more of the guards moves in the vertical direction, whereby the height position of the upper end of the liquid inlet and the height position of the lower end of the liquid inlet can be changed.

The controller controls the treating unit. The controller controls the guard driving unit in accordance with the shape of the substrate held by the substrate holder. This causes the controller to change at least either the height position of the upper end of the liquid inlet or the height position of the lower end of the liquid inlet. Consequently, the liquid inlet can be adjusted to be located at an appropriate height position in accordance with the shape of the substrate held by the substrate holder. This can cause the liquid collecting unit to collect the treatment liquid scattered from the substrate suitably regardless of the shape of the substrate held by the substrate holder. As a result, the treating unit can treat the substrate suitably.

As described above, the substrate treating apparatus according to the aspect of the present invention can perform suitable treatment on the substrates.

In the above-described substrate treating apparatus, it is preferred that the controller changes the height position of the upper end of the liquid inlet in accordance with a thickness of a main portion of the substrate, the main portion located inward of a peripheral portion of the substrate. This can cause the liquid collecting unit to collect the treatment liquid scattered from the substrate suitably regardless of the thickness of the main portion of the substrate. Accordingly, the treating unit can perform suitable treatment on the substrate regardless of the thickness of the main portion of the substrate.

In the above-described substrate treating apparatus, it is preferred that the upper end of the liquid inlet when the main portion of the substrate held by the substrate holder has a first thickness is higher than the upper end of the liquid inlet when the main portion of the substrate held by the substrate holder has a second thickness larger than the first thickness. The substrate is relatively thin when the main portion has the first thickness. When the relatively thin substrate is held by the substrate holder, the upper end of the liquid inlet is located at a relatively high position. This can cause the liquid collecting unit to collect the treatment liquid scattered from the substrate suitably. The substrate is relatively thick when the main portion has the second thickness. When the relatively thick substrate is held by the substrate holder, the upper end of the liquid inlet is located at a relatively low position. This can cause the liquid collecting unit to collect the treatment liquid scattered from the substrate suitably. Accordingly, the treating unit can perform suitable treatment on both the relatively thin substrate and the relatively thick substrate.

In the above-described substrate treating apparatus, it is preferred that the substrate includes
a first substrate that has a recess formed by a main portion of the substrate, located inward of a peripheral portion of the substrate, being recessed than the peripheral portion of the substrate, and
a second substrate that does not have the recess,
and that the controller changes the height position of the upper end of the liquid inlet depending on whether the substrate held by the substrate holder is the first substrate or the second substrate. The liquid collecting unit can collect the treatment liquid scattered from the substrate suitably even if the substrate is the first substrate or the second substrate. Accordingly, the treating unit can perform suitable treatment on both the first substrate and the second substrate.

In the above-described substrate treating apparatus, it is preferred that the upper end of the liquid inlet when the first substrate is held by the substrate holder is higher than the upper end of the liquid inlet when the second substrate is held by the substrate holder. When the first substrate is held by the substrate holder, the upper end of the liquid inlet is located at a relatively high position. This can cause the liquid collecting unit to collect the treatment liquid scattered from the first substrate suitably. When the second substrate is held by the substrate holder, the upper end of the liquid inlet is located at a relatively low position. This can cause the liquid collecting unit to collect the treatment liquid scattered from the second substrate suitably.

In the above-described substrate treating apparatus, it is preferred that the controller changes the height position of the upper end of the liquid inlet in accordance with whether the substrate held by the substrate holder has an upper recess portion formed on an upper face of the substrate by a main portion of the substrate, located inward of a peripheral portion of the substrate, being recessed than the peripheral portion of the substrate and whether the treatment liquid supplying unit supplies the treatment liquid to the upper face of the substrate held by the substrate holder. It is a matter that affects a direction of the treatment liquid scattered from the substrate whether the substrate held by the substrate holder has the upper recess portion. It is also a matter that affects the direction of the treatment liquid scattered from the substrate whether the treatment liquid supplying unit supplies the treatment liquid to the upper face of the substrate held by the substrate holder. The controller changes the height position of the upper end of the liquid inlet in consideration of both of the above matters. This can adjust the upper end of the liquid inlet to be located at an appropriate height position. This can cause the liquid collecting unit to collect the treatment liquid scattered from the substrate suitably.

Here, the upper face is a face of the substrate directed upward when the substrate is held by the substrate holder. The upper recess portion is a recess formed on the upper face of the substrate. The recess is formed by the main portion of the substrate that is recessed than the peripheral portion of the substrate.

In the above-described substrate treating apparatus, it is preferred that the upper end of the liquid inlet when the substrate held by the substrate holder has the upper recess portion and when the treatment liquid supplying unit supplies the treatment liquid to the upper face of the substrate held by the substrate holder is higher than the upper end of the liquid inlet when the substrate held by the substrate holder does not have the upper recess portion, and the upper end of the liquid inlet when the substrate held by the substrate holder has the upper recess portion and when the treatment liquid supplying unit supplies the treatment liquid to the upper face of the substrate is higher than the upper end of the liquid inlet when the treatment liquid supplying unit does not supply the treatment liquid to the upper face of the substrate held by the substrate holder.

When the substrate held by the holder substrate has the upper recess portion, the upper face of the substrate at the peripheral portion is positioned higher than the upper face of the substrate at the main portion. When the substrate held by the substrate holder does not have the upper recess portion, the upper face of the substrate is substantially flat. More specifically, the upper face of the substrate at the peripheral portion is located at substantially the same height position as the upper face of the substrate at the main portion. When the treatment liquid supplying unit supplies the treatment liquid to the upper face of the substrate held by the substrate holder, the treatment liquid flows along the upper face of the substrate. When the treatment liquid supplying unit does not supply the treatment liquid to the upper face of the substrate held by the substrate holder, the treatment liquid does not flow along the upper face of the substrate.

Such a state where the substrate held by the substrate holder has the upper recess portion and where the treatment liquid supplying unit supplies the treatment liquid to the upper face of the substrate held by the substrate holder is referred to as a "first upper treatment condition" for convenience. In the first upper treatment condition, the treatment liquid flows upward from the main portion to the peripheral portion along the upper face of the substrate. Consequently, in the first upper treatment condition, the treatment liquid easily scatters upward from the substrate. In the first upper treatment condition, the upper end of the liquid inlet is located at a relatively high position. This can cause the liquid collecting unit to collect the treatment liquid scattered from the substrate suitably even in the first upper treatment condition.

When the substrate does not have the upper recess portion, the treatment liquid is hard to scatter upward from the substrate rather than in the first upper treatment condition. When the substrate does not have the upper recess portion, the upper end of the liquid inlet is positioned lower than that in the first upper treatment condition. This can cause the liquid collecting unit to collect the treatment liquid scattered from the substrate suitably even when the substrate held by the substrate holder does not have the upper recess portion.

When the treatment liquid supplying unit does not supply the treatment liquid to the upper face of the substrate, the treatment liquid is hard to scatter upward from the substrate rather than in the first upper treatment condition. When the treatment liquid supplying unit does not supply the treatment liquid to the upper face of the substrate, the upper end of the liquid inlet is positioned lower than that in the first upper treatment condition. This can cause the liquid collecting unit to collect the treatment liquid scattered from the substrate suitably even when the treatment liquid supplying unit does not supply the treatment liquid to the upper face of the substrate held by the substrate holder.

In the above-described substrate treating apparatus, it is preferred that the upper end of the liquid inlet when the treatment liquid supplying unit does not supply the treatment liquid to the upper face of the substrate held by the substrate holder is lower than the upper end of the liquid inlet when the treatment liquid supplying unit supplies the treatment liquid to the upper face of the substrate held by the substrate holder. When the treatment liquid supplying unit does not supply the treatment liquid to the upper face of the substrate, the treatment liquid is hard to scatter upward from the substrate rather than when the treatment liquid supplying unit supplies the treatment liquid to the upper face of the substrate. When the treatment liquid supplying unit does not supply the treatment liquid to the upper face of the substrate, the upper end of the liquid inlet is positioned lower than that when the treatment liquid supplying unit supplies the treatment liquid to the upper face of the substrate. This can cause the liquid collecting unit to collect the treatment liquid scattered from the substrate more suitably when the treatment liquid supplying unit does not supply the treatment liquid to the upper face of the substrate held by the substrate holder.

In the above-described substrate treating apparatus, it is preferred that the controller changes the height position of the lower end of the liquid inlet in accordance with whether the substrate held by the substrate holder has a lower recess portion formed on a lower face of the substrate by the main portion of the substrate, located inward of the peripheral portion of the substrate, being recessed than the peripheral portion of the substrate and whether the treatment liquid supplying unit supplies the treatment liquid to the lower face of the substrate held by the substrate holder. It is a matter that largely affects a direction of the treatment liquid scattered from the substrate whether the substrate held by the substrate holder has the lower recess portion. It is also a matter that largely affects a direction of the treatment liquid scattered from the substrate whether the treatment liquid supplying unit supplies the treatment liquid to the lower face of the substrate held by the substrate holder. The controller changes the height position of the lower end of the liquid inlet in consideration of both of the above matters. This can adjust the lower end of the liquid inlet to be located at an appropriate height position. This can cause the liquid collecting unit to collect the treatment liquid scattered from the substrate suitably.

Here, the lower face is a face of the substrate directed downward when the substrate is held by the substrate holder. The lower recess portion is a recess formed on the lower face of the substrate. The recess is formed by the main portion of the substrate that is recessed than the peripheral portion of the substrate.

In the above-described substrate treating apparatus, it is preferred that the lower end of the liquid inlet when the substrate held by the substrate holder has the lower recess portion and when the treatment liquid supplying unit supplies the treatment liquid to the lower face of the substrate held by the substrate holder is lower than the lower end of the liquid inlet when the substrate held by the substrate holder does not have the lower recess portion, and the lower end of the liquid inlet when the substrate held by the substrate holder has the lower recess portion and when the treatment liquid supplying unit supplies the treatment liquid to the lower face of the substrate held by the substrate holder is lower than the lower end of the liquid inlet when the treatment liquid supplying unit does not supply the treatment liquid to the lower face of the substrate held by the substrate holder.

When the substrate held by the holder substrate has the lower recess portion, the lower face of the substrate at the peripheral portion is positioned lower than the lower face of the substrate at the main portion. When the substrate held by the substrate holder does not have the lower recess portion, the lower face of the substrate is substantially flat. More specifically, the lower face of the substrate at the peripheral portion is located at substantially the same height position as the lower face of the substrate at the main portion. When the treatment liquid supplying unit supplies the treatment liquid to the lower face of the substrate held by the substrate holder, the treatment liquid flows along the lower face of the substrate. When the treatment liquid supplying unit does not supply the treatment liquid to the lower face of the substrate held by the substrate holder, the treatment liquid does not flow along the lower face of the substrate.

Such a state where the substrate held by the substrate holder has the lower recess portion and where the treatment liquid supplying unit supplies the treatment liquid to the lower face of the substrate held by the substrate holder is referred to as a "first lower treatment condition" for convenience. In the first lower treatment condition, the treatment liquid flows downward from the main portion to the peripheral portion along the lower face of the substrate. Consequently, in the first lower treatment condition, the treatment liquid easily scatters downward from the substrate. In the first lower treatment condition, the lower end of the liquid inlet is located at a relatively low position. This can cause the liquid collecting unit to collect the treatment liquid scattered from the substrate suitably even in the first lower treatment condition.

When the substrate does not have the lower recess portion, the treatment liquid is hard to scatter downward from the substrate rather than in the first lower treatment condition. When the substrate does not have the lower recess portion, the lower end of the liquid inlet is positioned higher than that in the first lower treatment condition. This can cause the liquid collecting unit to collect the treatment liquid scattered from the substrate suitably even when the substrate held by the substrate holder does not have the lower recess portion.

When the treatment liquid supplying unit does not supply the treatment liquid to the lower face of the substrate, the treatment liquid is hard to scatter downward from the substrate rather than in the first lower treatment condition. When the treatment liquid supplying unit does not supply the treatment liquid to the lower face of the substrate, the lower end of the liquid inlet is positioned higher than that in the first lower treatment condition. This can cause the liquid collecting unit to collect the treatment liquid scattered from the substrate suitably even when the treatment liquid supplying unit does not supply the treatment liquid to the lower face of the substrate held by the substrate holder.

In the above-described substrate treating apparatus, it is preferred that the substrate has a recess formed by a main portion of the substrate, located inward of a peripheral portion of the substrate, being recessed than the peripheral portion of the substrate, and the controller changes at least either the height position of the upper end of the liquid inlet or the height position of the lower end of the liquid inlet in accordance with a depth of the main portion of the substrate relative to the peripheral portion of the substrate. This can cause the liquid collecting unit to collect the treatment liquid scattered from the substrate suitably regardless of the depth of the main portion of the substrate relative to the peripheral portion of the substrate. Accordingly, the treating unit can perform suitable treatment on the substrate regardless of the depth of the main portion of the substrate relative to the peripheral portion of the substrate.

In the above-described substrate treating apparatus, it is preferred that the substrate includes
a recess formed by a main portion of the substrate, located inward of a peripheral portion of the substrate, being recessed than the peripheral portion of the substrate, and
a wall formed between the peripheral portion of the substrate and the main portion of the substrate,
and that the controller changes at least either the height position of the upper end of the liquid inlet or the height position of the lower end of the liquid inlet in accordance with an angle of the wall. This can cause the liquid collecting unit to collect the treatment liquid scattered from the substrate suitably regardless of the angle of the wall. Accordingly, the treating unit can perform suitable treatment on the substrate regardless of the angle of the wall.

In the above-described substrate treating apparatus, it is preferred that the substrate holder includes
a plate,
a supporting member protruding upward from a top face of the plate, and contacting a lower face of the substrate to support the substrate at a position higher than the top face of the plate, and
a gas outlet formed on the top face of the plate, and configured to blow a gas between the top face of the plate and the lower face of the substrate supported by the supporting member, and to suck the substrate downward. The substrate holder includes the plate, the supporting member, and the gas outlet. Accordingly, the substrate holder can suitably hold the substrate.

In the above-described substrate treating apparatus, it is preferred that the controller includes
a memory unit configured to store a plurality of set values about at least either the height position of the upper end of the liquid inlet or the height position of the lower end of the liquid inlet, and
a setting unit configured to switch among the set values stored in the memory unit in accordance with the shape of the substrate held by the substrate holder. The controller includes the memory unit and the setting unit. Accordingly, the controller can determine at least either the height position of the upper end of the liquid inlet or the height position of the lower end of the liquid inlet suitably.

Another aspect of the present invention provides a substrate treating method, including
a step of holding a substrate by a substrate holder in a horizontal posture,
a step of moving guards, arranged to surround the substrate holder laterally, in a vertical direction in accordance with a shape of the substrate held by the substrate holder, thereby changing at least either a height position of an upper end of a liquid inlet, defined by the guards and open toward the substrate held by the substrate holder, or a height position of a lower end of the liquid inlet, and
a step of rotating the substrate holder, supplying a treatment liquid to the substrate held by the substrate holder and receiving the treatment liquid, passing through the liquid inlet, with the guards.

In the substrate treating method, the guards move in the vertical direction in accordance with the shape of the substrate held by the substrate holder. Accordingly, at least either the height position of the upper end of the liquid inlet or the height position of the lower end of the liquid inlet is changed in accordance with the shape of the substrate held by the substrate holder. Here, the liquid inlet is defined by the guards. The liquid inlet is open toward the substrate held by the substrate holder. Consequently, the liquid inlet can be adjusted to be located at an appropriate height position in accordance with the shape of the substrate held by the substrate holder. Specifically, the liquid inlet can be located at an appropriate height position such that the treatment liquid scattered from the substrate passes through the liquid inlet regardless of the shape of the substrate held by the substrate holder. Accordingly, the treatment liquid scattered from the substrate can be received by the guards regardless of the shape of the substrate held by the substrate holder. As a result, a substrate can be treated suitably.

As described above, the substrate treating method according to the aspect of the present invention can perform suitable treatment on the substrates.

Advantageous Effects of Invention

Suitable treatment can be performed on the substrates with the substrate treating apparatus and the substrate treating method according to the present invention.

BRIEF DESCRIPTION OF DRAWINGS

FIG. 6 is a flow chart showing procedures of control by a controller and operation of the treating unit.

DESCRIPTION OF EMBODIMENTS

The following describes a substrate treating apparatus of the present invention with reference to the drawings.

First Embodiment

Outline of Substrate Treating Apparatus

Figure 1:
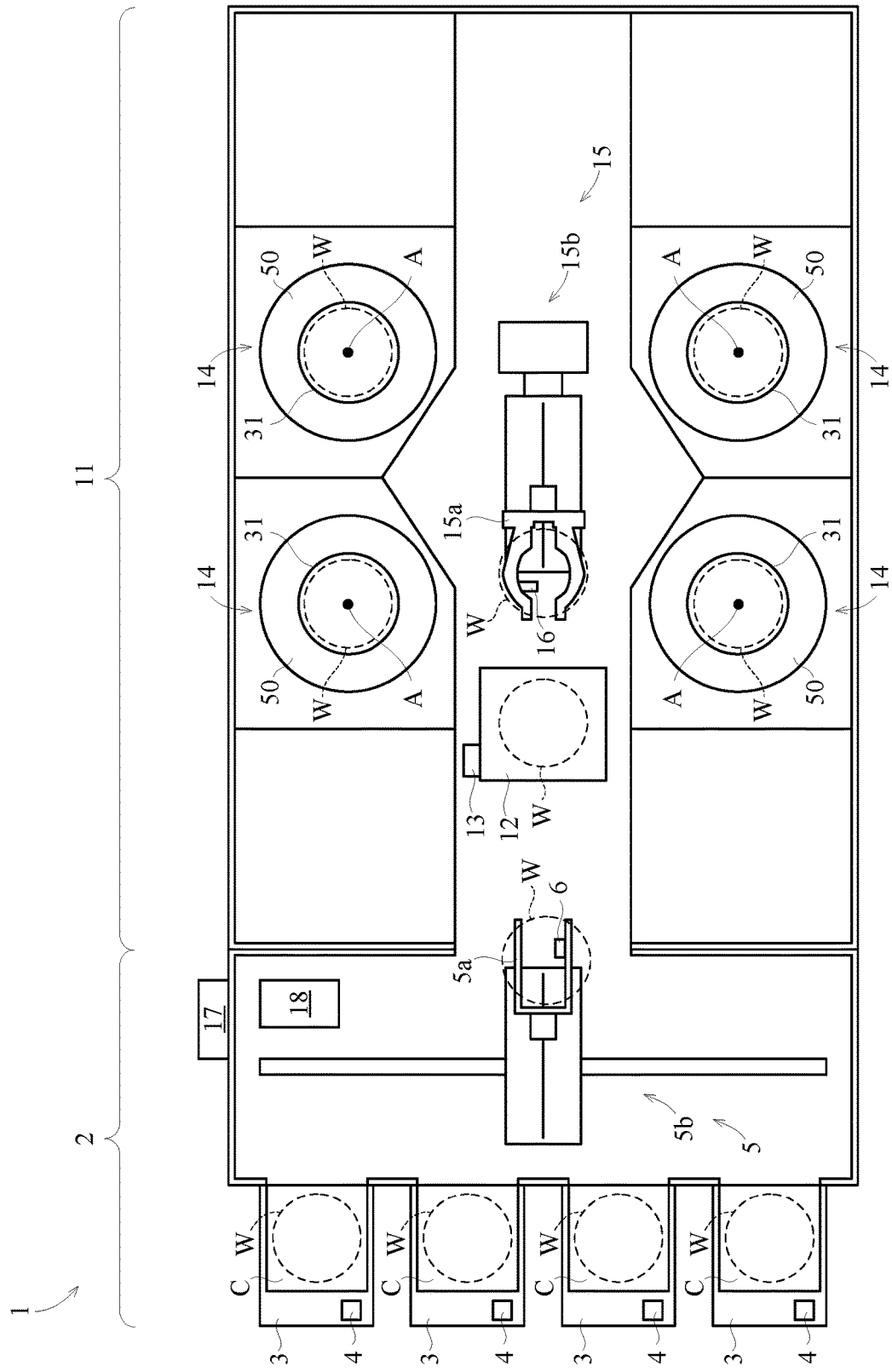
FIG. 1 is a plan view of a substrate treating apparatus according to a first embodiment.

FIG. 1 is a plan view of the substrate treating apparatus according to a first embodiment. A substrate treating apparatus 1 performs a treatment to substrates (e.g., semiconductor wafers) W.

Examples of the substrates W include a semiconductor wafer, a substrate for liquid crystal display, a substrate for organic electroluminescence (EL), a substrate for flat plasma display (FPD), a substrate for optical display, a magnetic disk substrate, an optical disk substrate, a magneto-optical disk substrate, a substrate for photomask, and a solar cell substrate.

The substrate treating apparatus 1 includes an indexer 2. The indexer 2 includes a plurality of (e.g., four) carrier platforms 3. The carrier platforms 3 each include one carrier C placed thereon. The carrier C accommodates a plurality of substrates W. The carrier C is, for example, a front opening unified pod (FOUP).

The carrier C has a bar code (not shown). The bar code is, for example, an identifier for identifying a carrier C. The bar code is, for example, an identifier for identifying a substrate W in the carrier C. The bar code is, for example, attached to an outer face of the carrier C.

The indexer 2 includes barcode readers 4. The barcode readers 4 read bar codes attached to the carriers C placed on the carrier platforms 3 individually. The barcode readers 4 are attached to the carrier platforms 3, for example.

The indexer 2 includes a transport mechanism 5. The transport mechanism 5 is accessible to the carriers C placed on the carrier platforms 3, respectively. The transport mechanism 5 is configured to transport a substrate W to the carrier C placed on the carrier platform 3. The transport mechanism 5 includes a hand 5a and a hand driving unit 5b. The hand 5a supports one substrate W in a horizontal posture. The hand driving unit 5b is coupled to the hand 5a. The hand driving unit 5b moves the hand 5a. For example, the hand driving unit 5b moves the hand 5a in parallel in a horizontal direction. For example, the hand driving unit 5b moves the hand 5a in parallel in a vertical direction. For example, the hand driving unit 5b rotatably moves the hand 5a around a rotation axis. The rotation axis of the hand 5a is, for example, parallel to the vertical direction.

The indexer 2 includes a presence/absence detector 6. The presence/absence detector 6 detects whether or not the hand 5a supports a substrate W. That is, the presence/absence detector 6 detects whether or not the transport mechanism 5 transports a substrate W. The presence/absence detector 6 is attached to the hand 5a, for example.

The substrate treating apparatus 1 includes a treating block 11. The treating block 11 is connected to the indexer 2.

The treating block 11 includes a mount table 12. The mount table 12 places a plurality of substrates W thereon.

The treating block 11 includes a shape detector 13. The shape detector 13 detects a shape of a substrate W placed on the mount table 12. The shape detector 13 is, for example, an image sensor for imaging a substrate W. The image sensor is, for example, a one-dimensional image sensor or a two-dimensional image sensor. The shape detector 13 is attached to the mount table 12, for example.

The treating block 11 includes a plurality of treating units 14. The treating units 14 each are configured to treat one substrate W.

The treating block 11 includes a transport mechanism 15. The transport mechanism 15 is accessible to the mount table 12 and all the treating units 14. The transport mechanism 15 transports substrates W to the mount table 12 and the treating units 14. The transport mechanism 15 includes a hand 15a and a hand driving unit 15b. The hand 15a supports one substrate W in a horizontal posture. The hand driving unit 15b is coupled to the hand 15a. The hand driving unit 15b moves the hand 15a. For example, the hand driving unit 15b moves the hand 15a in parallel in the horizontal direction. For example, the hand driving unit 15b moves the hand 15a in parallel in the vertical direction. For example, the hand driving unit 15b rotatably moves the hand 15a around a rotation axis. The rotation axis of the hand 15a is, for example, parallel to the vertical direction.

The treating block 11 includes a presence/absence detector 16. The presence/absence detector 16 detects whether or not the hand 15a supports a substrate W. That is, the presence/absence detector 16 detects whether or not the transport mechanism 15 transports a substrate W. The presence/absence detector 16 is attached to the hand 15a, for example.

The mount table 12 is located between the transport mechanism 5 and the transport mechanism 15. The transport mechanism 5 is accessible also to the mount table 12. The transport mechanism 5 transports substrates W to the mount table 12. The mount table 12 places substrates W transported between the transport mechanism 5 and the transport mechanism 15.

The substrate treating apparatus 1 includes an input unit 17. A user can input information to the input unit 17. The input unit 17 is attached to an outer face of the indexer 2, for example.

The substrate treating apparatus 1 includes a controller 18. The controller 18 obtains detection results from the barcode readers 4, the presence/absence detectors 6 and 16, and the shape detector 13. The controller 18 obtains the information that the input unit 17 receives. The controller 18 is configured to control the transport mechanisms 5 and 15, and the treating units 14.

Figure 2:
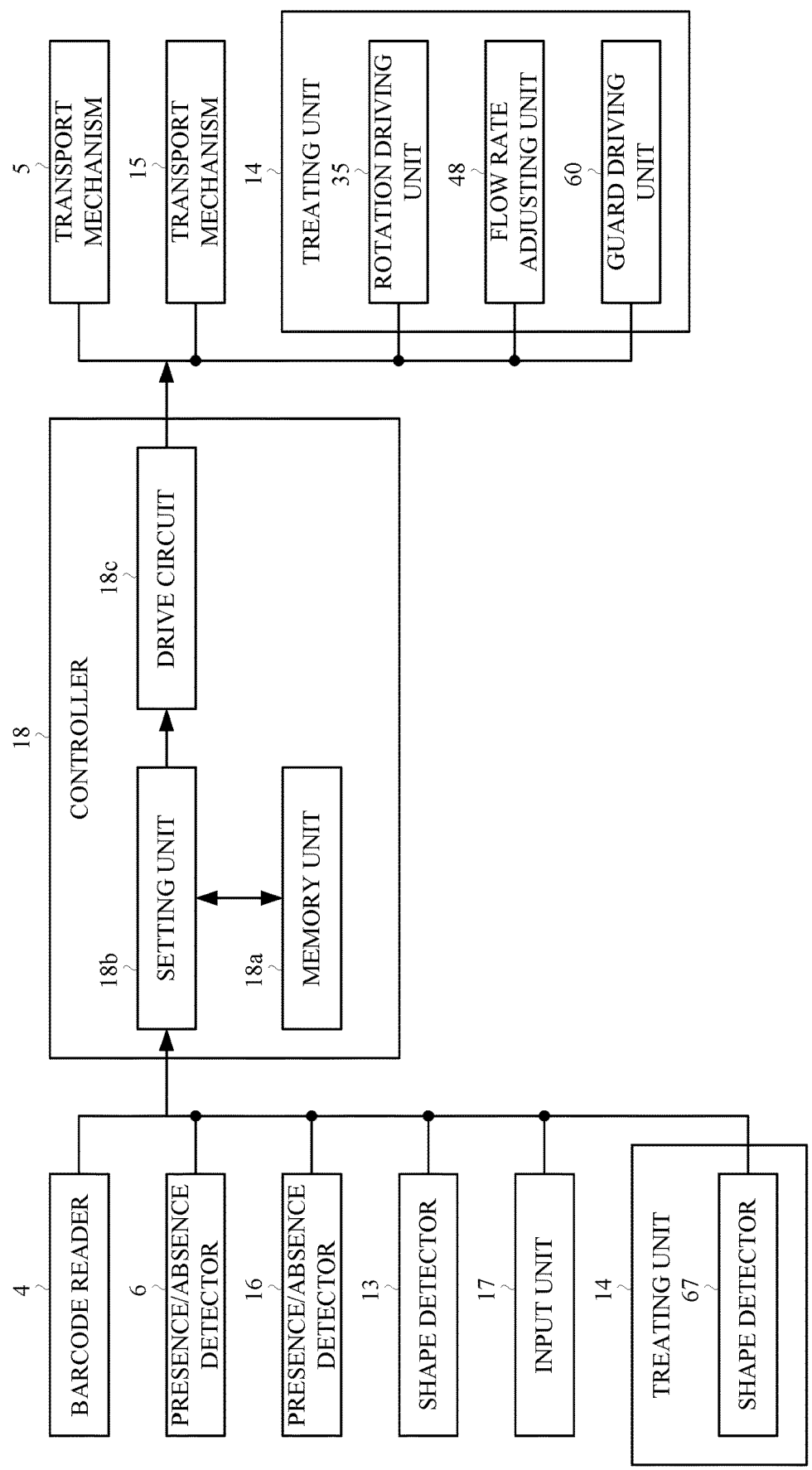
FIG. 2 is a control block diagram of the substrate treating apparatus.

FIG. 2 is a control block diagram of the substrate treating apparatus 1. The controller 18 is communicatably connected to the barcode readers 4, the presence/absence detectors 6 and 16, the shape detector 13, the input unit 17, the transport mechanisms 5 and 15, and the treating units 14. The controller 18 includes a memory unit 18a, a setting unit 18b, and a drive circuit 18c. The memory unit 18a stores various kinds of information in advance. The information stored in the memory unit 18a is, for example, set values about operating conditions of the transport mechanisms 5 and 15 and the treating units 14. The information stored in the memory unit 18a is, for example, a treatment recipe (processing program) for treating the substrates W. The information stored in the memory unit 18a is, for example, information on identification of the substrates W. The setting unit 18b sets operating conditions of the transport mechanisms 5 and 15 and the treating units 14 in accordance with the information obtained from the barcode readers 4, the presence/absence detectors 6 and 16, the shape detector 13, and the input unit 17 as well as the information stored in advance in the memory unit 18a. The drive circuit 18c outputs drive commands to the transport mechanisms 5 and 15 and the treating units 14 in accordance with the operating conditions set by the setting unit 18b.

The controller 18 is implemented by a central processing unit (CPU) that performs various processes, a random-access memory (RAM) as a workspace of arithmetic processing, and a storage medium such as a fixed disk, for example.

The following describes one example of operation of the substrate treating apparatus 1. The transport mechanism 5 transports a substrate W from a carrier C on the carrier platform 3 to the mount table 12. The transport mechanism 15 transports the substrate W from the mount table 12 to the treating unit 14. The treating unit 14 treats the substrate W. The transport mechanism 15 transports the substrate W from the treating unit 14 to the mount table 12. The transport mechanism 5 transports the substrate W from the mount table 12 to a carrier C on the carrier platform 3.

Shape of Substrate W

Figure 3:
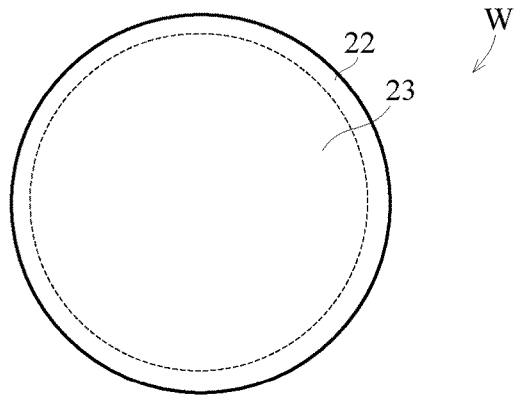
FIG. 3 is a plan view of a substrate.

FIG. 3 is a plan view of a substrate W. The following describes a basic shape of the substrate W. The substrate W has a thin flat shape. The substrate W has a substantially circular shape in plan view. The substrate W has a peripheral portion 22 and a main portion 23. The main portion 23 is a part of the substrate W located inward of the peripheral portion 22. Semiconductor devices are formed in the main portion 23. FIG. 3 shows a border of the peripheral portion 22 and the main portion 23 by dotted lines for convenience.

The substrate treating apparatus 1 can perform treatment on various shapes of substrates W. The following exemplarily describes three types of substrates W different in shape. The three types of substrates W different in shape are called an A-type substrate WA, a B-type substrate WB, and a C-type substrate WC for convenience.

Figure 4A:
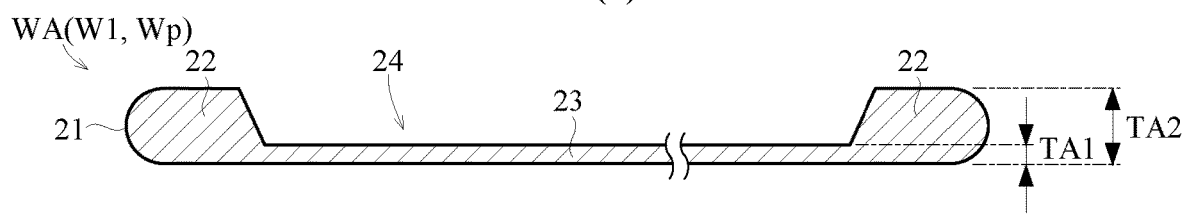
FIG. 4(a) is a cross-sectional view of an A-type substrate.
Figure 4B:
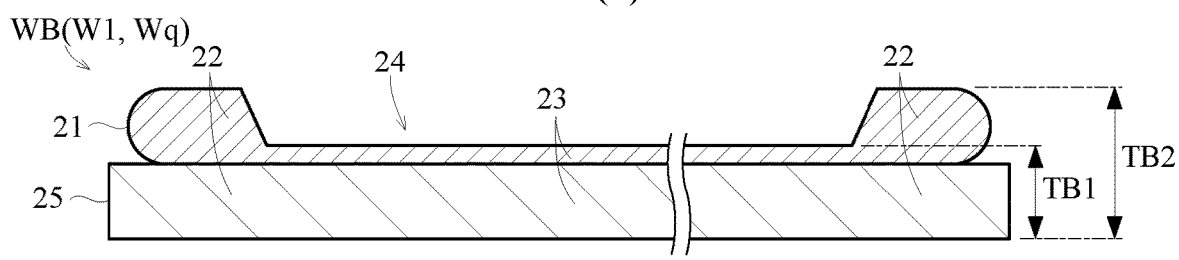
FIG. 4(b) is a cross-sectional view of a B-type substrate.
Figure 4C:
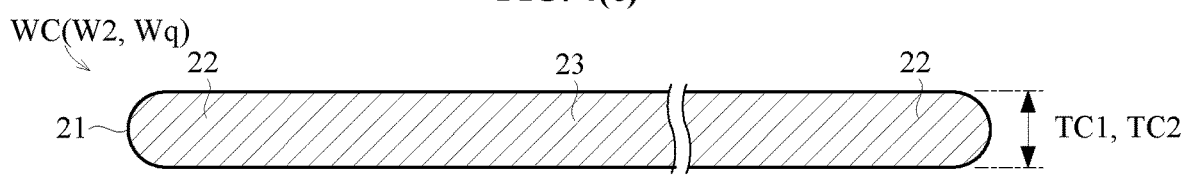
FIG. 4(c) is a cross-sectional view of a C-type substrate.

FIG. 4(*a*) is a cross sectional view of the A-type substrate WA. The A-type substrate WA is a substrate W that has a recess 24 formed by the main portion 23 being recessed than the peripheral portion 22, and does not include a protective plate made of glass. The recess 24 is formed, for example, by a grinding process. The A-type substrate WA may be formed by a substrate body 21 only. Alternatively, the A-type substrate WA may include, in addition to the substrate body 21, at least one selected from a resin coating, a resin tape, a resin sheet, and a resin film.

FIG. 4(*b*) is a cross sectional view of the B-type substrate WB. The B-type substrate WB is a substrate W that has a recess 24 and includes a protective plate 25 made of glass. Specifically, the B-type substrate WB has a substrate body 21 and includes the protective plate 25. The protective plate 25 adheres to the substrate body 21, for example. The B-type substrate WB may also include at least one selected from a resin coating, a resin tape, a resin sheet, and a resin film.

FIG. 4(*c*) is a cross sectional view of the C-type substrate WC. The C-type substrate WC is a substrate W not having the recess 24. The C-type substrate WC is flat over the peripheral portion 22 and the main portion 23. The C-type substrate WC may be formed by the substrate body 21 only. Alternatively, the C-type substrate WC may include, in addition to the substrate body 21, at least one selected from a resin coating, a resin tape, a resin sheet, a resin film, and a protective plate 25.

The main portion 23 of the A-type substrate WA is thinner than the main portion 23 of the B-type substrate WB. The main portion 23 of the A-type substrate WA is thinner than the main portion 23 of the C-type substrate WC. The A-type substrate WA has rigidity lower than those of the B-type substrate WB and the C-type substrate WC. The A-type substrate WA is more likely to bend than the B-type substrate WB and the C-type substrate WC.

Specifically, the main portion 23 of the A-type substrate WA has a thickness TA1. The main portion 23 of the B-type substrate WB has a thickness TB1. The main portion 23 of the C-type substrate WC has a thickness TC1. The thickness TA1 is smaller than the thickness TB1. The thickness TA1 is smaller than the thickness TC1. The thickness TA1 is, for example, 10 µm or more and 200 µm or less. The thickness TB1 is, for example, 800 µm or more and 1200 µm or less. The thickness TC1 is, for example, 600 µm or more and 1000 µm or less.

The peripheral portion 22 of the A-type substrate WA has a thickness TA2. The peripheral portion 22 of the B-type substrate WB has a thickness TB2. The peripheral portion 22 of the C-type substrate WC has a thickness TC2. The thickness TA2 is smaller than the thickness TB2. The thickness TA2 is, for example, equal to the thickness TC2. The thickness TA2 is, for example, 600 µm or more and 1000 µm or less. The thickness TB2 is, for example, 1400 µm or more and 2200 µm or less. The thickness TC2 is, for example, 600 µm or more and 1000 µm or less.

The A-type substrate WA and the B-type substrate WB are examples of a first substrate in the present invention. The C-type substrate WC is one example of a second substrate in the present invention. The A-type substrate WA and the B-type substrate WB will be collectively called hereinafter the "first substrate W1" as appropriate. The C-type substrate WC will be called the "second substrate W2" as appropriate.

The A-type substrate WA is one example of a thin substrate in the present invention. The B-type substrate WB and the C-type substrate WC are examples of a thick substrate in the present invention. The A-type substrate WA will be called hereinafter the "thin substrate Wp" as appropriate. The B-type substrate WB and the C-type substrate WC will be called the "thick substrate Wq" as appropriate.

Construction of Treating Unit

Figure 5:
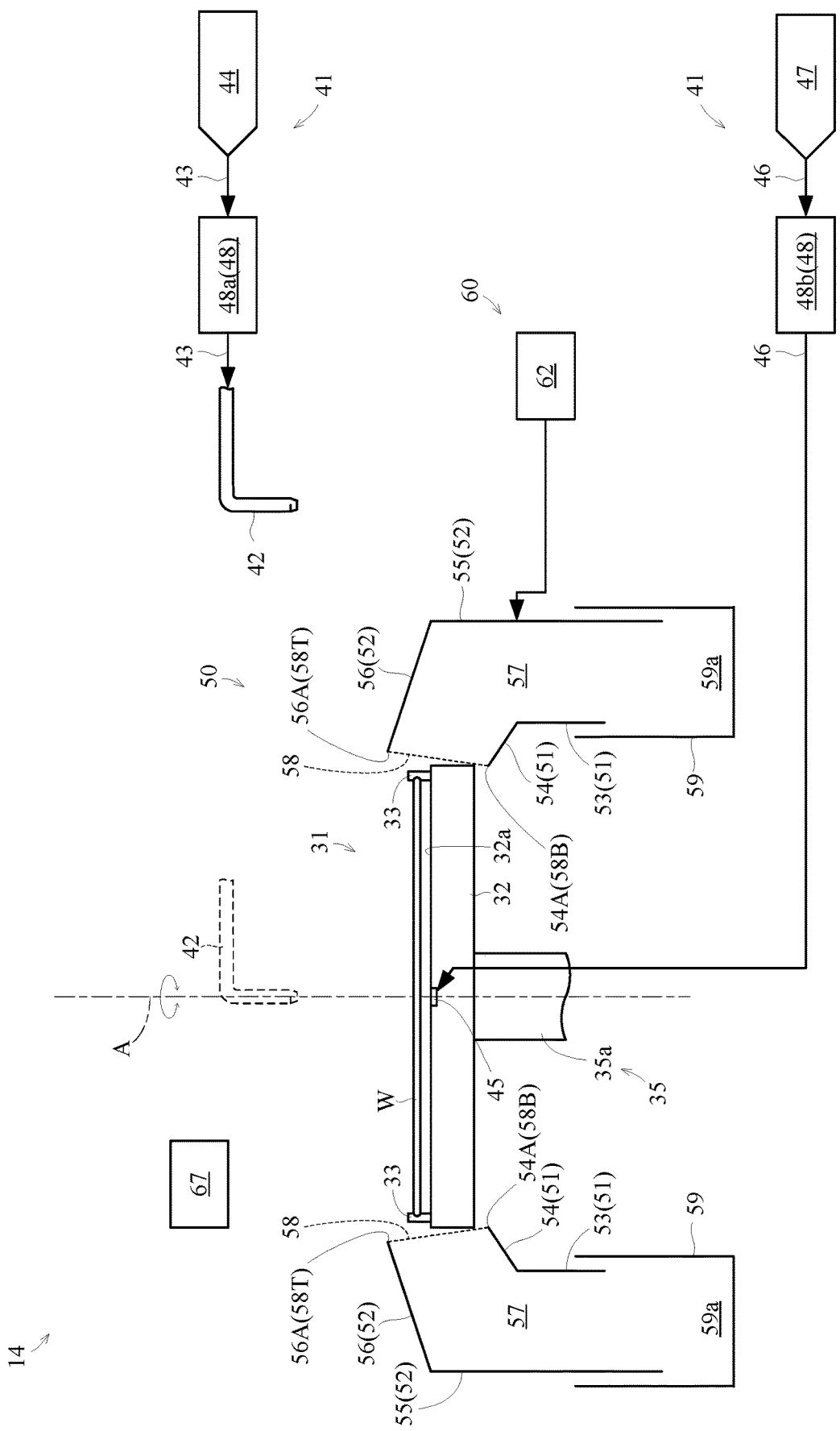
FIG. 5 is a diagram schematically showing a construction of a treating unit.

FIG. 5 is a diagram schematically showing the treating unit 14. The treating unit 14 includes a substrate holder 31, a rotation driving unit 35, a treatment liquid supplying unit 41, and a liquid collecting unit 50. The substrate holder 31 is configured to hold one substrate W. The substrate holder 31 is configured to hold the substrate W in a horizontal posture. The rotation driving unit 35 is configured to rotate the substrate holder 31. The treatment liquid supplying unit 41 is configured to supply a treatment liquid to the substrate W held by the substrate holder 31. The liquid collecting unit 50 is configured to collect a treatment liquid scattered from the substrate W.

The substrate holder 31 includes a plate 32. The plate 32 has substantially a discal shape. The plate 32 includes a top face 32a. The top face 32a is substantially horizontal. The top face 32a is substantially flat.

The rotation driving unit 35 is coupled to a lower part of the plate 32. The rotation driving unit 35 rotates the plate 32 around a rotation axis A. The rotation axis A is parallel to the vertical direction. The rotation axis A passes through the center of the plate 32. More specifically, the rotation driving unit 35 includes a rotation shaft 35a. The rotation shaft 35a extends in the vertical direction. The rotation shaft 35a is located on the rotation axis A. The rotation shaft 35a is connected to the lower part of the plate 32. The rotation driving unit 35 further includes a motor not shown. The motor is coupled to the rotation shaft 35a. The motor causes the rotation shaft 35a to rotate around the rotation axis A.

The substrate holder 31 further includes a plurality of edge contact pins 33. The edge contact pins 33 are also called a mechanical chuck. The edge contact pins 33 are attached to the plate 32. The edge contact pins 33 protrude upward from the top face 32a of the plate 32. The edge contact pins 33 may each be rotatable relative to the plate 32. The edge contact pins 33 may each have a movable part that is movable relative to the plate 32. The edge contact pins 33 contact an edge of the substrate W. When the edge contact pins 33 contact the edge of the substrate W, the edge contact pins 33 may also push the edge of the substrate W toward the center of the substrate W. The edge contact pins 33 hold the substrate W at a position higher than the top face 32a of the plate 32. When the edge contact pins 33 hold the substrate W, the center of the substrate W is positioned on the rotation axis A. When the rotation driving unit 35 rotates the plate 32, the edge contact pins 33 rotate integrally with the plate 32. When the rotation driving unit 35 rotates the substrate holder 31, the edge contact pins 33 do not slide relative to the substrate W contacting the edge contact pins 33. When the rotation driving unit 35 rotates the substrate holder 31, the substrate W held by the substrate holder 31 also rotates integrally with the plate 32.

The treatment liquid supplying unit 41 includes a first nozzle 42. The first nozzle 42 dispenses the treatment liquid. The first nozzle 42 dispenses the treatment liquid downward. The first nozzle 42 is located at a position higher than the substrate W held by the substrate holder 31. The first nozzle 42 supplies the treatment liquid to the upper face of the substrate W held by the substrate holder 31.

The treating unit 14 includes a nozzle moving mechanism, not shown. The nozzle moving mechanism moves the first nozzle 42 between a treating position and a retreating position. FIG. 4 shows the first nozzle 42 in the treating position by dotted lines. FIG. 4 shows the first nozzle 42 in the retreating position by solid lines. The treating position is a position above the substrate W held by the substrate holder 31. When the first nozzle 42 is in the treating position, the first nozzle 42 overlaps the substrate W held by the substrate holder 31 in plan view. When the first nozzle 42 is in the retreating position, the first nozzle 42 does not overlap the substrate W held by the substrate holder 31 in plan view.

The treatment liquid supplying unit 41 includes a first pipe 43. The first pipe 43 supplies the treatment liquid to the first nozzle 42. The first pipe 43 has a first end and a second end. The first end of the first pipe 43 is connected to a treatment liquid supplying source 44. The second end of the first pipe 43 is connected to the first nozzle 42.

The treatment liquid supplying unit 41 includes a second nozzle 45. The second nozzle 45 dispenses the treatment liquid. The second nozzle 45 dispenses the treatment liquid upward. The second nozzle 45 is located at a position lower than the substrate W held by the substrate holder 31. The second nozzle 45 supplies the treatment liquid to the lower face of the substrate W held by the substrate holder 31.

The second nozzle 45 is formed on the plate 32, for example. The second nozzle 45 is formed on the top face 32a of the plate 32, for example. The second nozzle 45 is formed in the middle of the top face 32a of the plate 32, for example. The second nozzle 45 is located on the rotation axis A. The second nozzle 45 overlaps the substrate W held by the substrate holder 31 in plan view.

The treatment liquid supplying unit 41 includes a second pipe 46. The second pipe 46 supplies the treatment liquid to the second nozzle 45. The second pipe 46 may partially be formed inside of the plate 32, for example. The second pipe 46 may partially be formed inside of the rotation shaft 35a, for example. The second pipe 46 has a first end and a second end. The first end of the second pipe 46 is connected to a treatment liquid supplying source 47. The second end of the second pipe 46 is connected to the second nozzle 45.

The second nozzle 45 may dispense the treatment liquid same as the treatment liquid that the first nozzle 42 dispenses. The second nozzle 45 may dispense the treatment liquid different from the treatment liquid that the first nozzle 42 dispenses.

The treating unit 14 includes a flow rate adjusting unit 48. The flow rate adjusting unit 48 adjusts a flow rate of the treatment liquid supplied by the treatment liquid supplying unit 41 to the substrate W. The flow rate adjusting unit 48 includes a first flow rate adjusting unit 48a and a second flow rate adjusting unit 48b. The first flow rate adjusting unit 48a is provided in the first pipe 43. The first flow rate adjusting unit 48a adjusts a flow rate of the treatment liquid dispensed from the first nozzle 42. The second flow rate adjusting unit 48b is provided in the second pipe 46. The second flow rate adjusting unit 48b adjusts a flow rate of the treatment liquid dispensed from the second nozzle 45. The first flow rate adjusting unit 48a and the second flow rate adjusting unit 48b each include, for example, a flow rate regulating valve. The first flow rate adjusting unit 48a and the second flow rate adjusting unit 48b each include, for example, an on-off valve.

The liquid collecting unit 50 includes a first guard 51 and a second guard 52. The first guard 51 and the second guard 52 each receive a treatment liquid. The first guard 51 and the second guard 52 are each arranged so as to surround the substrate holder 31 laterally. The first guard 51 has a substantially cylindrical shape with the rotation axis A as the center (generatrix). The second guard 52 also has a substantially cylindrical shape with the rotation axis A as the center. The second guard 52 is located outward of the first guard 51. The first guard 51 is located inward of the second guard 52.

Here, the term "inward" is a direction toward the rotation axis A. The term "inward" is a direction approaching the rotation axis A. The term "outward" is a direction opposite to the term, inward.

The first guard 51 is fixedly provided. The second guard 52 is provided so as to be movable in the vertical direction. The second guard 52 is movable in the vertical direction relative to the substrate holder 31.

The first guard 51 has a vertical portion 53. The vertical portion 53 is an annular peripheral wall centered on the rotation axis A. The vertical portion 53 extends in the vertical direction. The vertical portion 53 has an internal diameter approximately invariable in the vertical direction.

The first guard 51 has a slope portion 54. The slope portion 54 is an annular peripheral wall centered on the rotation axis A. The slope portion 54 is connected to the vertical portion 53. The slope portion 54 extends upward and inward from the vertical portion 53. The slope portion 54 has an internal diameter decreased upward.

The slope portion 54 has an upper edge 54A. The upper edge 54A has an annular shape with the rotation axis A as the center. The upper edge 54A is located at a position lower than the top face 32*a* of the plate 32. The upper edge 54A is located at a position close to the plate 32.

The second guard 52 has a vertical portion 55. The vertical portion 55 is an annular peripheral wall centered on the rotation axis A. The vertical portion 55 is located outward of the vertical portion 53. The vertical portion 55 extends in the vertical direction. The vertical portion 55 has an internal diameter approximately invariable in the vertical direction. The internal diameter of the vertical portion 55 is larger than the internal diameter of the vertical portion 53.

The second guard 52 has a slope portion 56. The slope portion 56 is an annular peripheral wall centered on the rotation axis A. The slope portion 56 is located above the slope portion 54. The slope portion 56 is connected to the vertical portion 55. The slope portion 56 extends upward and inward from the vertical portion 55. The slope portion 56 has an internal diameter decreased upward.

The slope portion 56 has an upper edge 56A. The upper edge 56A is located above the upper edge 54A. The upper edge 56A has an annular shape with the rotation axis A as the center. The inward of the upper edge 56A is open.

The first guard 51 and the second guard 52 are each one example of the guards in the present invention.

The liquid collecting unit 50 has a collecting space 57. The collecting space 57 is defined by the first guard 51 and the second guard 52. The collecting space 57 is a space formed between the first guard 51 and the second guard 52. The collecting space 57 includes a space above the slope portion 54 and below the slope portion 56. The collecting space 57 contains a space outward of the vertical portion 53 and inward of the vertical portion 55. The collecting space 57 has an annular shape with the rotation axis A as the center. The collecting space 57 is located so as to laterally surround the substrate W held by the substrate holder 31. The collecting space 57 is located outward of the substrate W held by the substrate holder 31.

The liquid collecting unit 50 includes a liquid inlet 58. FIG. 5 shows the liquid inlet 58 with dotted lines. The liquid inlet 58 is an opening that allows the treatment liquid to enter the collecting space 57. The liquid inlet 58 is open toward the substrate W held by the substrate holder 31. In other words, the liquid inlet 58 causes the collecting space 57 to open toward the substrate W. The treatment liquid scattered from the substrate W passes through the liquid inlet 58 into the collecting space 57.

The liquid inlet 58 is defined by the first guard 51 and the second guard 52. More specifically, the liquid inlet 58 is demarcated by the upper edge 54A of the slope portion 54 and the upper edge 56A of the slope portion 56. The liquid inlet 58 is located above the upper edge 54A of the slope portion 54 and below the upper edge 56A of the slope portion 56. The liquid inlet 58 is a curved surface formed by connecting the upper edge 54A of the slope portion 54 to the upper edge 56A of the slope portion 56. The liquid inlet 58 has an annular shape with the rotation axis A as the center. The liquid inlet 58 is located so as to laterally surround the substrate W held by the substrate holder 31. The liquid inlet 58 is located outward of the substrate W held by the substrate holder 31.

The liquid inlet 58 has an upper end 58T and a lower end 58B. The second guard 52 defines the upper end 58T. The upper edge 56A of the second guard 52 corresponds to the upper end 58T. The first guard 51 defines the lower end 58B. The upper edge 54A of the first guard 51 corresponds to the lower end 58B.

The liquid collecting unit 50 includes a cup 59. The cup 59 is located below the first guard 51 and the second guard 52. The treatment liquids received by the first guard 51 and the second guard 52 flow down to the cup 59. The cup 59 includes a groove 59*a*. The groove 59*a* is open upward. The groove 59*a* is continuous annularly. The vertical portion 53 of the first guard 51 is inserted into the groove 59*a*. The vertical portion 55 of the second guard 52 is also inserted into the groove 59*a*.

The treating unit 14 includes a discharge pipe, not shown. The discharge pipe is connected to the cup 59. More specifically, the discharge pipe is connected to a bottom of the groove 59*a*. The discharge pipe discharges the treatment liquid within the cup 59.

The treating unit 14 includes a guard driving unit 60. The guard driving unit 60 includes a guard drive mechanism 62. The guard drive mechanism 62 moves the second guard 52 in the vertical direction. The guard driving unit 60 does not move the first guard 51. The guard drive mechanism 62 includes, for example, an electric motor.

The guard driving unit 60 can move the upper edge 56A (i.e., upper end 58T) from a position lower than the top face 32*a* of the plate 32 to a position higher than the substrate W held by the substrate holder 31.

The treating unit 14 includes a shape detector 67. The shape detector 67 detects a shape of the substrate W placed on the substrate holder 31. The shape detector 67 is, for example, an image sensor for imaging a substrate W. The image sensor is, for example, a one-dimensional image sensor or a two-dimensional image sensor. The shape detector 67 is located above the substrate holder 31, for example.

Reference is made to FIG. 2. The controller 18 is also communicatively connected to the shape detector 67, the rotation driving unit 35, the flow rate adjusting unit 48, and the guard driving unit 60. The controller 18 obtains detection results of the shape detector 67. The controller 18 controls the rotation driving unit 35, the flow rate adjusting unit 48 (48a and 48b), and the guard driving unit 60 (guard drive mechanism 62).

Specifically, the setting unit 18b sets operating conditions in further consideration of information obtained from the shape detector 67. The drive circuit 18c outputs driving commands to the rotation driving unit 35, the flow rate adjusting unit 48 (48a and 48b), and the guard driving unit 60 (guard drive mechanism 62).

Exemplary Operation of Treating Unit 14 in First Embodiment

In an exemplary operation of the treating unit 14 in the first embodiment, the controller 18 changes the height position of the upper end 58T of the liquid inlet 58 in accordance with a thickness of the main portion 23 of the substrate W.

FIG. 6 is a flow chart showing procedures of control by the controller 18 and operation of the treating unit 14.

Step S1

The barcode reader 4 reads a bar code attached to a carrier C. The barcode reader 4 outputs detection result of the barcode reader 4 to the controller 18. The shape detector 13 detects a shape of a substrate W placed on the mount table 12. The shape detector 67 detects a shape of a substrate W held by the substrate holder 31. The shape detectors 13 and 67 output detection results thereof to the controller 18.

Step S2

The controller 18 obtains the detection results from the barcode reader 4 and the shape detectors 13 and 67. The controller 18 determines the shape of the substrate W held by the substrate holder 31 in accordance with the detection results of the barcode reader 4 and the shape detectors 13 and 67. Specifically, the setting unit 18b identifies the thickness of the main portion 23 of the substrate W.

Here, the controller 18 performs management in association with a position of the substrate W and the shape of the substrate W even after the substrate W is unload from the carrier C. Specifically, the controller 18 manages the shape of the substrate W that the transport mechanisms 5 and 15 transport at each time. The controller 18 manages the shape of the substrate W placed on the mount table 12 at each time. The controller 18 manages the shape of the substrate W held by the substrate holder 31 at each time. In order for the controller 18 to manage the position and the shape of the substrate W, the controller 18 may refer to the detected results of the shape detectors 13 and 67 and the detection results of the presence/absence detectors 6 and 16 as appropriate.

Step S3

The controller 18 (specifically, setting unit 18b) determines the height position of the upper end 58T of the liquid inlet 58 in accordance with the shape of the substrate W held by the substrate holder 31. The height position of the upper end 58T of the liquid inlet 58 is hereinafter abbreviated to an "upper height position HT".

For example, the memory unit 18a stores in advance a first upper set value VTa and a second upper set value VTb. The first upper set value VTa and the second upper set value VTb are each a set value about the upper height position HT. The setting unit 18b switches the first upper set value VTa and the second upper set value VTb in accordance with the shape of the substrate W held by the substrate holder 31. The setting unit 18b selects either the first upper set value VTa or the second upper set value VTb in accordance with the shape of the substrate W held by the substrate holder 31.

The first upper set value VTa and the second upper set value VTb each define the upper height position HT. The upper height position HT defined by the first upper set value VTa is denoted as a first upper height position HTa. The upper height position HT defined by the second upper set value VTb is denoted as a second upper height position HTb. The first upper height position HTa is higher than the second upper height position HTb. Accordingly, selection of the first upper set value VTa by the setting unit 18b corresponds to determination of the first upper height position HTa as a target of the upper height position HT by the controller 18. Selection of the second upper set value VTb by the setting unit 18b corresponds to determination of the second upper height position HTb as the target of the upper height position HT by the controller 18.

The first upper set value VTa and the second upper set value VTb are each an example of the set value in the present invention.

The controller 18 takes in consideration of a shape of a substrate W held by the substrate holder 31 for changing the upper height position HT. The shape of the substrate W that the controller 18 considers corresponds to, for example, the thickness of the main portion 23 of the substrate W held by the substrate holder 31.

For example, if the main portion 23 of the substrate W held by the substrate holder 31 has a first thickness, the first upper set value VTa is determined by the controller 18. For example, if the main portion 23 of the substrate W held by the substrate holder 31 has a second thickness larger than the first thickness, the second upper set value VTb is determined by the controller 18.

For example, if the main portion 23 of the substrate W held by the substrate holder 31 has a thickness smaller than a reference value RV, the first upper set value VTa is determined by the controller 18. If the main portion 23 of the substrate W held by the substrate holder 31 has a thickness larger than the reference value RV, the second upper set value VTb is determined by the controller 18.

The reference value RV is stored in advance in the memory unit 18a. The setting unit 18b compares the thickness of the main portion 23 of the substrate W, held by the substrate holder 31, with the reference value RV. Then, the setting unit 18a selects either the first upper set value VTa or the second upper set value VTb.

It is preferred that the reference value RV is larger than the thickness TA1 of the main portion 23 of the A-type substrate WA and smaller than the thickness TB1 of the main portion 23 of the B-type substrate WB and the thickness TC1 of the main portion 23 of the C-type substrate WC. For example, it is preferred that the reference value RV is 200 μm or more and 600 μm or less, for example. Accordingly, when the substrate W is the A-type substrate WA, the first upper set value Vta can be determined by the controller 18. In other words, when the substrate W is the thin substrate Wp, the controller 18 can determine the first upper set value VTa. When the substrate W is the B-type substrate WB or the C-type substrate WC, the second upper set value VTb can be determined by the controller 18. In other words, when the substrate W is the thick substrate wq, the controller 18 can determine the second upper set value VTb.

The controller 18 considers the shape of the substrate W based on whether the substrate W held by the substrate holder 31 belongs to the thin substrate Wp or the thick substrate wq, for example.

For example, if the substrate W held by the substrate holder 31 is the thin substrate Wp, the controller 18 selects the first upper set value VTa. For example, if the W held by the substrate holder 31 is the thick substrate wq, the controller 18 selects the second upper set value VTb.

The controller 18 considers the shape of the substrate W based on whether the substrate W held by the substrate holder 31 belongs to the A-type substrate WA, the B-type substrate WB, or the C-type substrate WC, for example.

For example, if the substrate W held by the substrate holder 31 is the A-type substrate WA, the controller 18 selects the first upper set value VTa. For example, if the substrate W held by the substrate holder 31 is either the B-type substrate WB or the C-type substrate WC, the controller 18 selects the second upper set value VTb.

Step S4

The controller 18 controls the treating unit 14. The controller 18 controls the guard driving unit 60 in accordance with the determined upper height position HT. Specifically, the drive circuit 18c drives the guard driving unit 60 in accordance with the switched set value. For example, when the setting unit 18b selects the first upper set value VTa, the drive circuit 18c outputs a drive command to the guard drive mechanism 62 in accordance with the first upper set value VTa. For example, when the setting unit 18b selects the second upper set value VTb, the drive circuit 18c outputs a drive command to the guard drive mechanism 62 in accordance with the second upper set value VTb.

Step S5

The treating unit 14 performs a treatment on the substrate W in response to control by the controller 18. Specifically, the substrate holder 31 holds a substrate W. The guard driving unit 60 moves the second guard 52 in the vertical direction. Accordingly, the upper end 58T of the liquid inlet 58 is located at the determined upper height position HT.

More specifically, when the setting unit 18b selects the first upper set value VTa, the upper end 58T of the liquid inlet 58 is located at the first upper height position HTa. When the setting unit 18b selects the second upper set value VTb, the upper end 58T of the liquid inlet 58 is located at the second upper height position HTb. In such a manner as above, the controller 18 changes the upper height position HT in accordance with the shape of the substrate W held by the substrate holder 31. For example, the controller 18 changes the upper height position HT in accordance with the thickness of the main portion 23 of the substrate W held by the substrate holder 31. For example, the controller 18 changes the upper height position HT depending on whether the substrate W held by the substrate holder 31 is the thin substrate Wp or the thick substrate wq. For example, the controller 18 changes the upper height position HT depending on whether the substrate W held by the substrate holder 31 is the A-type substrate WA, the B-type substrate WB, or the C-type substrate WC.

Figure 7A:
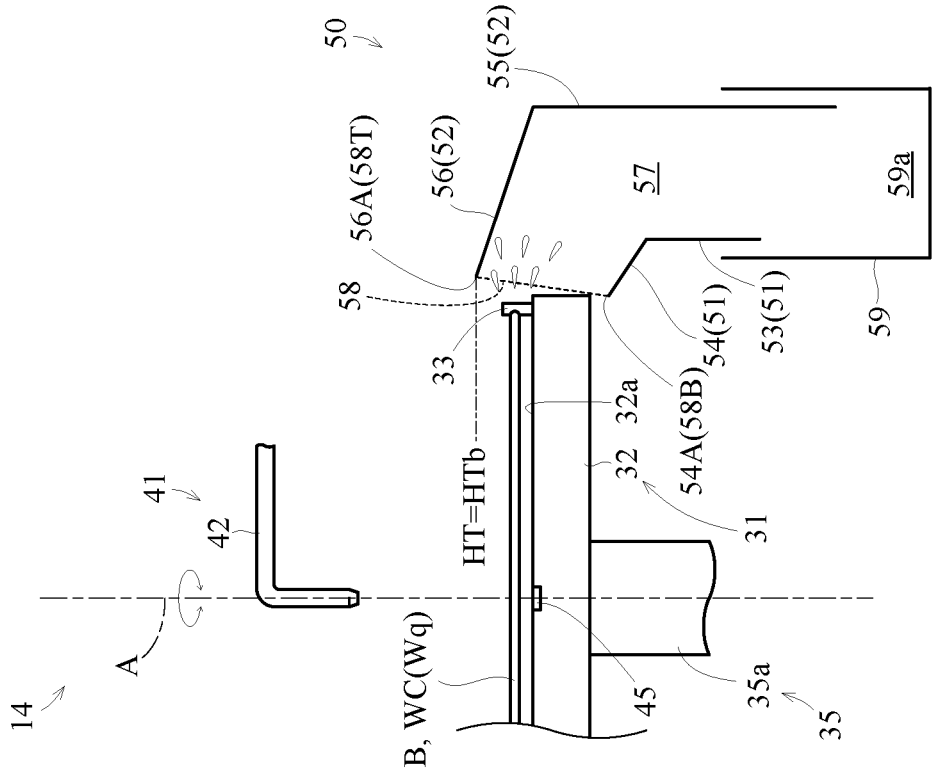
FIG. 7(a) and FIG. 7(b) are diagrams each schematically showing the treating unit.
Figure 7B:
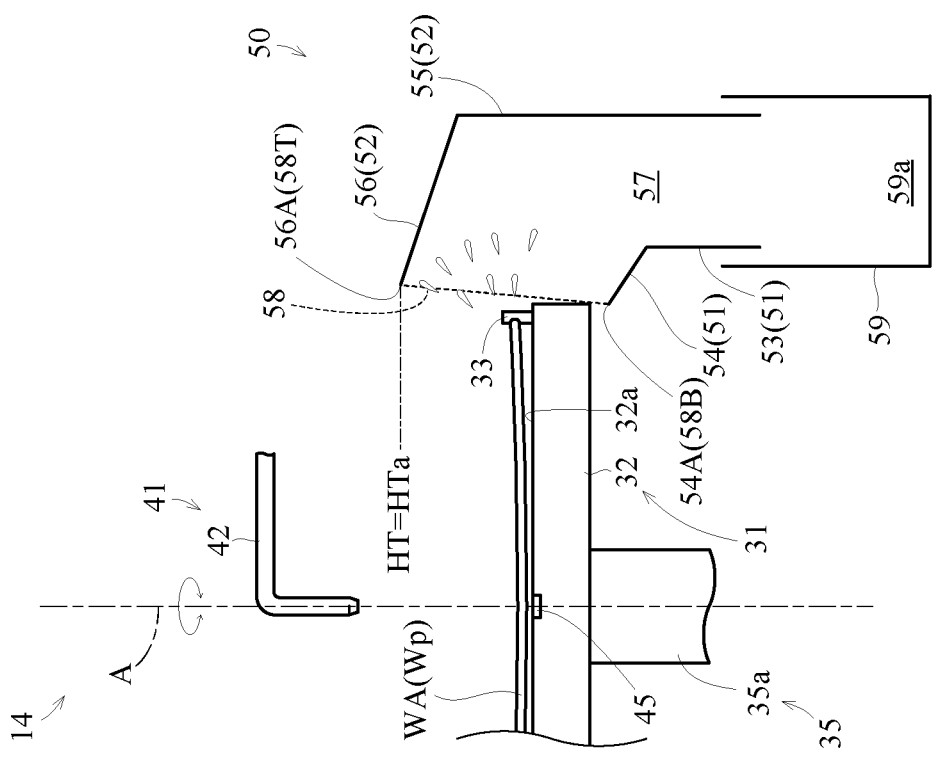

FIG. 7(a) and FIG. 7(b) are diagrams each schematically showing the treating unit 14. In FIG. 7(a), the A-type substrate WA is held by the substrate holder 31. In FIG. 7(b), the B-type substrate WB or C-type substrate WC is held by the substrate holder 31.

Reference is now made to FIG. 7(a). For example, if the substrate W held by the substrate holder 31 is the A-type substrate WA, the upper end 58T of the liquid inlet 58 is located at the first upper height position HTa (i.e., the upper height position HT defined by the first upper set value VTa). For example, if the substrate W held by the substrate holder 31 is the thin substrate Wp, the upper end 58T of the liquid inlet 58 is located at the first upper height position HTa.

Reference is made to FIG. 7(b). For example, if the substrate W held by the substrate holder 31 is the B-type substrate WB or C-type substrate WC, the upper end 58T of the liquid inlet 58 is located at the second upper height position HTb (i.e., the upper height position HT defined by the second upper set value VTb). For example, if the substrate W held by the substrate holder 31 is the thick substrate Wq, the upper end 58T of the liquid inlet 58 is located at the second upper height position HTb.

As illustrated, the second upper height position HTb is lower than the first upper height position HTa. In such a manner as above, the second guard 52 moves in the vertical direction in accordance with the shape of the substrate W held by the substrate holder 31. Movement of the second guard 52 changes the upper height position HT.

Subsequently, the rotation driving unit 35 rotates the substrate holder 31, and the flow rate adjusting unit 48 opens. This causes the treatment liquid supplying unit 41 to supply the treatment liquid to the substrate W held by the substrate holder 31 while the substrate W held by the substrate holder 31 rotates. Specifically, at least either the first nozzle 42 or the second nozzle 45 dispenses the treatment liquid to the substrate W. The treatment liquid is scattered outward from the substrate W held by the substrate holder 31. The scattered treatment liquid is collected by the liquid collecting unit 50. Specifically, the treatment liquid passes through the liquid inlet 58 into the collecting space 57. The first guard 51 and the second guard 52 receive the treatment liquid having entered the collecting space 57, and guide the treatment liquid to the cup 59.

Reference is made to FIG. 7(b). The B-type substrate WB and the C-type substrate WC each have higher rigidity than that of the A-type substrate WA. The B-type substrate WB and the C-type substrate WC are less likely to bend than the A-type substrate WA. When either the B-type substrate WB or the C-type substrate WC is held by the substrate holder 31, it is substantially horizontal. Accordingly, the treatment liquid can be easily scattered horizontally from the B-type substrate WB or the C-type substrate WC. That is, the treatment liquid is hard to be scattered upward from the B-type substrate WB or the C-type substrate WC.

As described above, the second upper height position HTb is lower than the first upper height position HTa. The upper end 58T of the liquid inlet 58 is not unnecessarily high relative to a range where the treatment liquid is scattered. Accordingly, once the treatment liquid is introduced into the collecting space 57, the treatment liquid hardly returns to the outside of the collecting space 57 through the liquid inlet 58. More specifically, the treatment liquid hardly returns from the collecting space 57 through the liquid inlet 58 to the substrate W held by the substrate holder 31. The treatment liquid scattered from the B-type substrate WB or the C-type substrate WC is hardly attached to the B-type substrate WB or the C-type substrate WC again. In such a manner as above, when the B-type substrate WB or the C-type substrate WC is held by the substrate holder 31, the liquid collecting unit 50 can collect the treatment liquid suitably. Accordingly, the treating unit 14 can perform a treatment to the B-type substrate WB and the C-type substrate WC with high quality.

Reference is now made to FIG. 7(a). When the A-type substrate WA is held by the substrate holder 31, it bends more largely than the B-type substrate WB and the C-type substrate WC. Specifically, the A-type substrate WA is curved convexly downward. The peripheral portion 22 of the A-type substrate WA is inclined outward and upward. Consequently, the treatment liquid is easily scattered upward from the A-type substrate WA. The treatment liquid is easily scattered from the A-type substrate WA to a relatively high position.

As described above, the first upper height position HTa is higher than the second upper height position HTb. Accordingly, even when the treatment liquid is scattered from the A-type substrate WA to the relatively high position, the liquid inlet 58 can introduce the treatment liquid to the collecting space 57 accurately. In such a manner as above, even when the A-type substrate WA is held by the substrate holder 31, the liquid collecting unit 50 can collect the treatment liquid suitably. Accordingly, the treating unit 14 can perform a treatment on the A-type substrate WA with high quality.

Effect of First Embodiment

The rotation driving unit 35 rotates the substrate holder 31, whereby the substrate W held by the substrate holder 31 rotates. The treatment liquid supplying unit 41 supplies the treatment liquid to the substrate W held by the substrate holder 31. The treatment liquid is scattered from the substrate W held by the substrate holder 31. The liquid collecting unit 50 collects the treatment liquid scattered from the substrate W. The liquid collecting unit 50 includes the first guard 51 and the second guard 52. The first guard 51 and the second guard 52 are arranged so as to surround the substrate holder 31 laterally. The liquid collecting unit 50 further includes the liquid inlet 58. The liquid inlet 58 is defined by the first guard 51 and the second guard 52. The liquid inlet 58 is open toward the substrate W held by the substrate holder 31. The liquid inlet 58 introduces the treatment liquid, scattered from the substrate, into the liquid collecting unit 50. The guard driving unit 60 is configured to move the second guard 52 in the vertical direction. Movement of the second guard 52 in the vertical direction can change the upper height position HT.

The controller 18 controls the guard driving unit 60 in accordance with the shape of the substrate W held by the substrate holder 31. In such a manner as above, the controller 18 changes the upper height position HT. Consequently, the liquid inlet 58 can be adjusted to be located at an appropriate height position in accordance with the shape of the substrate W held by the substrate holder 31. This can cause the liquid collecting unit 50 to collect the treatment liquid scattered from the substrate W suitably regardless of the shape of the substrate W held by the substrate holder 31. As a result, the treating unit 14 can treat the substrate W suitably.

As described above, the substrate treating apparatus 1 according to the aspect of the present invention can perform suitable treatment on substrates W.

The controller 18 includes the memory unit 18a and the setting unit 18b. The memory unit 18a is configured to store the first upper set value VTa and the second upper set value VTb. The setting unit 18b is configured to switch among the first upper set value VTa and the second upper set value VTb in accordance with the shape of the substrate W held by the substrate holder 31. In such a manner as above, the controller 18 can determine the upper height position HT suitably in accordance with the shape of the substrate W held by the substrate holder 31. The controller 18 can change the upper height position HT suitably in accordance with the shape of the substrate W held by the substrate holder 31.

The treating unit 14 performs treatment on the substrate W (step S5). The treating unit 14 performs the treatment on the substrate W with a treating method including three steps. A first step is made by holding a substrate W by the substrate holder 31 in the horizontal posture. A second step is made by moving the second guard 52 in the vertical direction in accordance with the shape of the substrate W held by the substrate holder 31, thereby changing the upper height position HT. A third step is made by rotating the substrate holder 31, supplying the treatment liquid to the substrate W held by the substrate holder 31 and receiving the treatment liquid, passing through the liquid inlet 58, with the first guard 51 and the second guard 52. As a result, the treating unit 14 can treat the substrate W suitably.

The controller 18 changes the upper height position HT in accordance with the thickness of the main portion 23 of the substrate W. This can cause the liquid collecting unit 50 to collect the treatment liquid scattered from the substrate W suitably regardless of the thickness of the main portion 23 of the substrate W. Accordingly, the treating unit 14 can perform suitable treatment on the substrate W regardless of the thickness of the main portion 23 of the substrate W.

When the main portion 23 of the substrate W held by the substrate holder 31 has the first thickness, the upper end 58T of the liquid inlet 58 is located at the first upper height position HTa. When the substrate W held by the substrate holder 31 has the second thickness larger than the first thickness, the upper end 58T of the liquid inlet 58 is located at the second upper height position HTb lower than the first upper height position HTa. When the main portion 23 of the substrate W held by the substrate holder 31 has the first thickness as described above, the upper end 58T of the liquid inlet 58 is located at a relatively high position. This can cause the liquid collecting unit 50 to collect the treatment liquid scattered from the substrate W suitably. Moreover, when the main portion 23 of the substrate W having the second thickness is held by the substrate holder 31, the upper end 58T of the liquid inlet 58 is located at a relatively low position. This can cause the liquid collecting unit 50 to collect the treatment liquid scattered from the substrate W suitably. As described above, the liquid collecting unit 50 can collect the treatment liquid scattered from the substrate W suitably even both when the substrate W is relatively thin and when the substrate W is relatively thick. Accordingly, the treating unit 14 can perform suitable treatment on both the substrates W whose main portion 23 has the first thickness and the substrates W whose main portion 23 has the second thickness.

The treating unit 14 includes the shape detector 67. The shape detector 67 detects the shape of the substrate W. The controller 18 obtains detection results of the shape detector 67. The controller 18 determines the shape of the substrate W held by the substrate holder 31 in accordance with the detection results of the shape detector 67. Accordingly, the controller 18 can identify the shape of the substrate W held by the substrate holder 31 suitably. For example, the controller 18 can identify the thickness of the main portion 23 of the substrate W suitably.

The substrate treating apparatus 1 includes barcode readers 4. The barcode readers 4 read the bar code attached to the carrier C. The controller 18 obtains the detection results from the barcode readers 4. The controller 18 determines the shape of the substrate W in accordance with the detection result of the barcode readers 4. Accordingly, the controller 18 can identify the shape of the substrate W suitably.

The substrate treating apparatus 1 includes the shape detector 13. The shape detector 13 detects the shape of the substrate W. The controller 18 obtains detection results of the shape detector 13. The controller 18 determines the shape of the substrate W in accordance with the detection results of the shape detector 13. Accordingly, the controller 18 can identify the shape of the substrate W suitably.

Second Embodiment

The following describes one embodiment of a substrate treating apparatus 1 according to a second embodiment with reference to drawings. Like numerals are used to identify like components which are the same as those in the first embodiment, and the components will not particularly be described.

The substrate treating apparatus 1 of the second embodiment has a structure substantially equal to that of the substrate treating apparatus 1 of the first embodiment. A treating unit 14 of the second embodiment operates in a different manner from that of the treating unit 14 of the first embodiment. The following exemplarily describes operation of the treating unit 14 of the second embodiment.

Exemplary Operation of Treating Unit 14 in Second Embodiment

In an exemplary operation of the treating unit 14 in the second embodiment, the controller 18 changes the upper height position HT in accordance with whether a substrate W has a recess 24. That is, the controller 18 changes the upper height position HT depending on whether the substrate W is a first substrate W1 or a second substrate W2.

Figure 8:
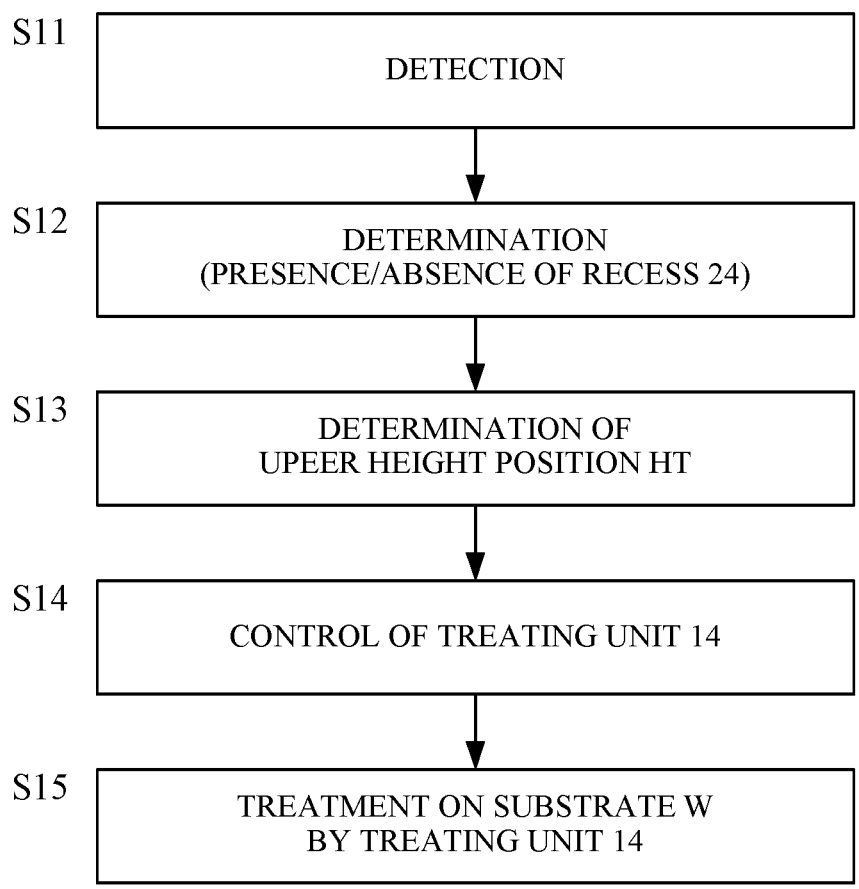
FIG. 8 is a flow chart showing procedures of control by a controller and operation of a treating unit according to a second embodiment.

FIG. 8 is a flow chart showing procedures of control by the controller 18 and operation of the treating unit 14.
Step S11
This step S11 is substantially the same as step S1 in the first embodiment. That is, the barcode reader 4 reads a bar code attached to a carrier C. The shape detectors 13 and 67 each detect a shape of a substrate W. The barcode reader 4 and the shape detectors 13 and 67 output detection results thereof to the controller 18.
Step S12
The controller 18 obtains the detection results from the barcode reader 4 and the shape detectors 13 and 67. The controller 18 determines the shape of the substrate W held by the substrate holder 31 in accordance with the detection results of the barcode reader 4 and the shape detectors 13 and 67. Specifically, the setting unit 18b identifies whether the substrate W has the recess 24. The setting unit 18b identifies whether the substrate W is the first substrate W1 or the second substrate W2.
Step S13
The controller 18 (specifically, setting unit 18b) determines the upper height position HT in accordance with the shape of the substrate W held by the substrate holder 31.

For example, the memory unit 18a stores in advance a first upper set value VTc and a second upper set value VTd. The first upper set value VTc and the second upper set value VTd are each a set value about the upper height position HT. The setting unit 18b switches the first upper set value VTc and the second upper set value VTd in accordance with the shape of the substrate W held by the substrate holder 31. The setting unit 18b selects either the first upper set value VTc or the second upper set value VTd in accordance with the shape of the substrate W held by the substrate holder 31.

The first upper set value VTc and the second upper set value VTd each define the upper height position HT. The upper height position HT defined by the first upper set value VTc is denoted as a first upper height position HTc. The upper height position HT defined by the second upper set value VTd is denoted as a second upper height position HTd.

The first upper height position HTc is higher than the second upper height position HTd. Accordingly, selection of the first upper set value VTc by the setting unit 18b corresponds to determination of the first upper height position HTc as a target of the upper height position HT by the controller 18. Selection of the second upper set value VTd by the setting unit 18b corresponds to determination of the second upper height position HTd as the target of the upper height position HT by the controller 18.

The first upper set value VTc and the second upper set value VTd are each an example of the set value in the present invention.

The controller 18 takes in consideration of the shape of a substrate W held by the substrate holder 31 for changing the upper height position HT. The shape of the substrate W that the controller 18 considers is, for example, whether the substrate W held by the substrate holder 31 has the recess 24.

For example, if the substrate W held by the substrate holder 31 has the recess 24, the first upper set value VTc is determined by the controller 18. If the substrate W held by the substrate holder 31 does not have the recess 24, the second upper set value VTd is determined by the controller 18.

The controller 18 considers the shape of the substrate W based on whether the substrate W held by the substrate holder 31 belongs to the first substrate W1 or the second substrate W2, for example.

For example, if the substrate W held by the substrate holder 31 is the first substrate W1, the first upper set value VTc is determined by the controller 18. If the substrate W held by the substrate holder 31 is the second substrate W2, the second upper set value VTd is determined by the controller 18.

The controller 18 considers the shape of the substrate W based on whether the substrate W held by the substrate holder 31 belongs to the A-type substrate WA, the B-type substrate WB, or the C-type substrate WC, for example.

For example, if the substrate W held by the substrate holder 31 is the A-type substrate WA or the B-type substrate WB, the first upper set value VTc is determined by the controller 18. If the substrate W held by the substrate holder 31 is the C-type substrate WC, the second upper set value VTd is determined by the controller 18.
Step S14
The controller 18 controls the treating unit 14. The controller 18 controls the guard driving unit 60 in accordance with the determined upper height position HT. Specifically, the drive circuit 18c drives the guard driving unit 60 in accordance with the switched set value. For example, when the setting unit 18b selects the first upper set value VTc, the drive circuit 18c outputs a drive command to the guard drive mechanism 62 in accordance with the first upper set value VTc. For example, when the setting unit 18b selects the second upper set value VTd, the drive circuit 18c outputs a drive command to the guard drive mechanism 62 in accordance with the second upper set value VTd.
Step S15
The treating unit 14 performs a treatment on a substrate W in response to control by the controller 18. Specifically, the substrate holder 31 holds the substrate W. The guard driving unit 60 moves the second guard 52 in the vertical direction. Accordingly, the upper end 58T of the liquid inlet 58 is located at the determined upper height position HT.

More specifically, when the setting unit 18b selects the first upper set value VTc, the upper end 58T of the liquid inlet 58 is located at the first upper height position HTc. When the setting unit 18b selects the second upper set value VTd, the upper end 58T of the liquid inlet 58 is located at the second upper height position HTd. In such a manner as above, the controller 18 changes the upper height position HT in accordance with the shape of the substrate W held by the substrate holder 31. For example, the controller 18 changes the upper height position HT depending on whether the substrate W held by the substrate holder 31 has the recess 24. For example, the controller 18 changes the upper height position HT depending on whether the substrate W held by the substrate holder 31 is the first substrate W1 or the second substrate W2. For example, the controller 18 changes the upper height position HT depending on whether the substrate W held by the substrate holder 31 is the A-type substrate WA, the B-type substrate WB, or the C-type substrate WC.

If the substrate W held by the substrate holder 31 has the recess 24, the upper end 58T of the liquid inlet 58 is adjusted to be located at the first upper height position HTc (i.e., the upper height position HT defined by the first upper set value VTc). If the substrate W held by the substrate holder 31 is the first substrate W1, the upper end 58T of the liquid inlet 58 is adjusted to be located at the first upper height position HTc. If the substrate W held by the substrate holder 31 is the A-type substrate WA or the B-type substrate WB, the upper end 58T of the liquid inlet 58 is adjusted to be located at the first upper height position HTc.

If the substrate W held by the substrate holder 31 does not have the recess 24, the upper end 58T of the liquid inlet 58 is adjusted to be located at the second upper height position HTd (i.e., the upper height position HT defined by the second upper set value VTd). If the substrate W held by the substrate holder 31 is the second substrate W2, the upper end 58T of the liquid inlet 58 is adjusted to be located at the second upper height position HTd. If the substrate W held by the substrate holder 31 is the C-type substrate WC, the upper end 58T of the liquid inlet 58 is adjusted to be located at the second upper height position HTd.

Subsequently, the treatment liquid supplying unit 41 supplies the treatment liquid to the substrate W held by the substrate holder 31 while the rotation driving unit 35 rotates the substrate holder 31. The liquid collecting unit 50 collects the treatment liquid scattered from the substrate W.

The first substrate W1 has the recess 24. The second substrate W2 does not have the recess 24. Accordingly, a range where the treatment liquid is scattered from the first substrate W1 may be larger than a range where the treatment liquid is scattered from the second substrate W2. The range where the treatment liquid is scattered from the first substrate W1 may be higher than the range where the treatment liquid is scattered from the second substrate W2.

As described above, the first upper height position HTc is higher than the second upper height position HTd. Accordingly, the liquid inlet 58 can introduce the treatment liquid, scattered from the substrate W, into the collecting space 57 accurately even when the substrate W held by the substrate holder 31 is either the first substrate W or the second substrate W2.

Effect of Second Embodiment

The controller 18 controls the guard driving unit 60 in accordance with the shape of the substrate W held by the substrate holder 31, thereby changing the upper height position HT also in the second embodiment, which feature is similar to the first embodiment. Consequently, the liquid inlet 58 can be adjusted to be located at an appropriate height position in accordance with the shape of the substrate W held by the substrate holder 31. This can cause the liquid collecting unit 50 to collect the treatment liquid scattered from the substrate W suitably regardless of the shape of the substrate W held by the substrate holder 31. As a result, the treating unit 14 can treat the substrate W suitably. That is, the substrate treating apparatus 1 can treat substrates W suitably.

In the second embodiment, the controller 18 changes the upper height position HT depending on whether the substrate W held by the substrate holder 31 is the first substrate W1 or the second substrate W2. Accordingly, the liquid collecting unit 50 can collect the treatment liquid scattered from the substrate W suitably even when the substrate W is the first substrate W1 or the second substrate W2. Accordingly, the treating unit 14 can perform suitable treatment on both the first substrate W1 and the second substrate W2.

When the first substrate W1 is held by the substrate holder 31, the upper end 58T of the liquid inlet 58 is located at the first upper height position HTc. When the second substrate W2 is held by the substrate holder 31, the upper end 58T of the liquid inlet 58 is located at the second upper height position HTd lower than the first upper height position HTc. As described above, when the first substrate W1 is held by the substrate holder 31, the upper end 58T of the liquid inlet 58 is located at a relatively high position. This can cause the liquid collecting unit 50 to collect the treatment liquid scattered from the first substrate W1 suitably. When the second substrate W2 is held by the substrate holder 31, the upper end 58T of the liquid inlet 58 is located at a relatively low position. This can cause the liquid collecting unit 50 to collect the treatment liquid scattered from the second substrate W2 suitably.

The memory unit 18a is configured to store the first upper set value VTc and the second upper set value VTd. The setting unit 18b is configured to switch among the first upper set value VTc and the second upper set value VTd in accordance with the shape of the substrate W held by the substrate holder 31. Accordingly, the controller 18 can change the upper height position HT suitably in accordance with the shape of the substrate W held by the substrate holder 31.

Third Embodiment

The following describes a substrate treating apparatus 1 according to a third embodiment with reference to drawings. Like numerals are used to identify like components which are the same as those in the first embodiment, and the components will not particularly be described.

A treating unit 14 of the third embodiment differs from the treating unit 14 of the first embodiment. Specifically, in the treating unit 14 of the third embodiment, a height position of the lower end 58B of the liquid inlet 58 is adjustable. The following exemplarily describes a construction and operation of the treating unit 14 of the third embodiment.

Construction of Treating Unit 14 in Third Embodiment

Figure 9:
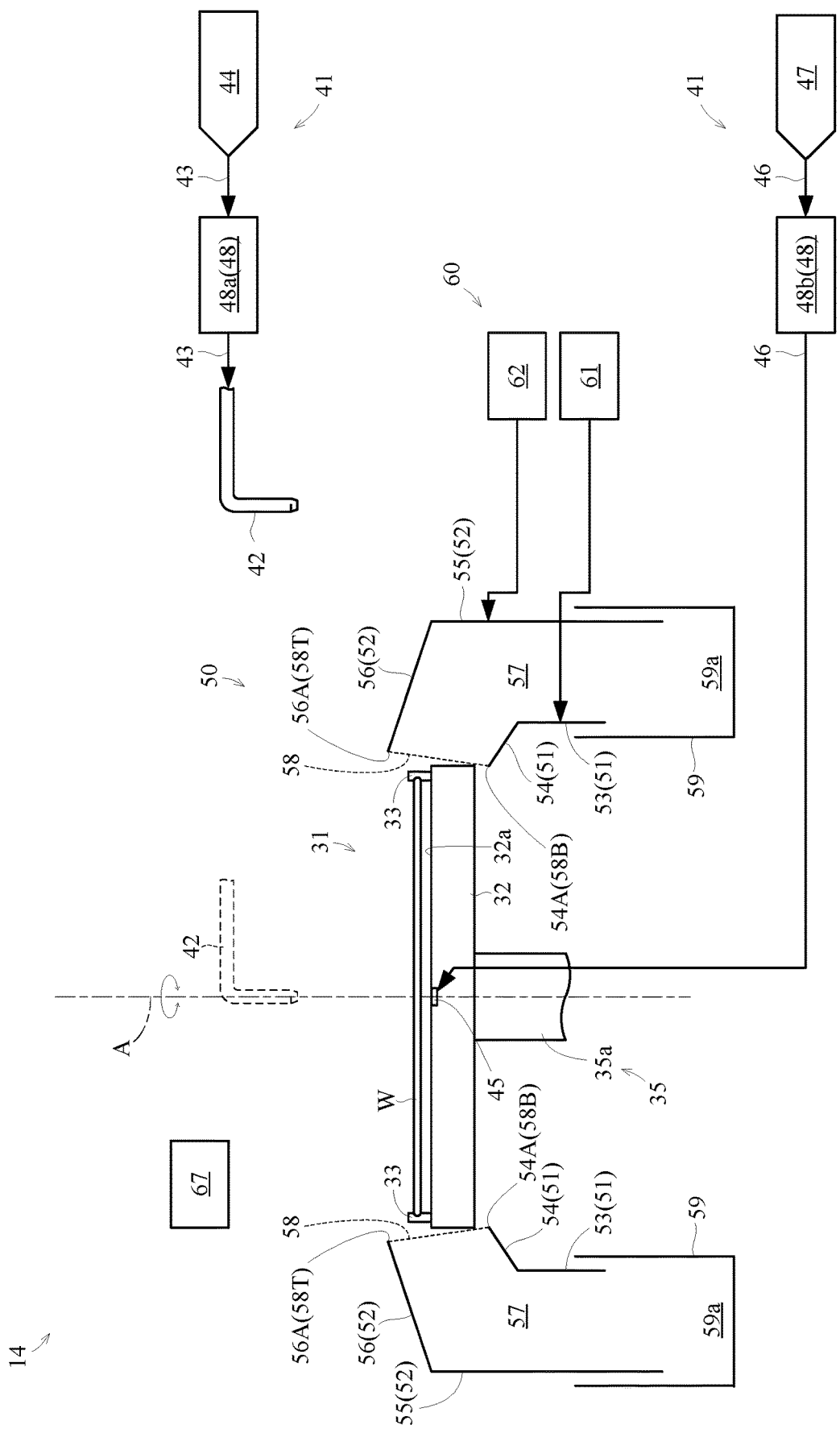
FIG. 9 is a diagram schematically showing a construction of a treating unit according to a third embodiment.

FIG. 9 is a diagram schematically showing the treating unit 14. A first guard 51 is provided so as to be movable in the vertical direction. The first guard 51 is movable in a vertical direction relative to a substrate holder 31. A guard driving unit 60 moves both the first guard 51 and a second guard 52 in the vertical direction.

The guard driving unit 60 includes a guard drive mechanism 61 in addition to the guard drive mechanism 62. Hereunder, the guard drive mechanism 61 is called a first guard drive mechanism 61 and the guard driving unit 62 is called a second guard drive mechanism 62 for convenience. The first guard drive mechanism 61 moves the first guard 51 in the vertical direction. The second guard drive mechanism 62 moves the second guard 52 in the vertical direction. The first guard drive mechanism 61 and the second guard drive mechanism 62 are operable independently of each other. The first guard drive mechanism 61 includes, for example, an electric motor. The second guard drive mechanism 62 includes, for example, an electric motor.

The first guard 51 and the second guard 52 are movable independently of each other in the vertical direction. Note that an upper edge 54A of a slope portion 54 of the first guard 51 is always lower than an upper edge 56A of a slope portion 56 of the second guard 52.

The controller 18 controls the guard driving unit 60. Specifically, the controller 18 controls the first guard drive mechanism 61 and the second guard drive mechanism 62.

Exemplary Operation of Treating Unit 14 in Third Embodiment

In an exemplary operation of the treating unit 14 in the third embodiment, the controller 18 determines the height position of the liquid inlet 58 in accordance with a site of the substrate W where the recess 24 is located and a site of the substrate W where the treatment liquid is supplied. The controller 18 determines a height position of the lower end 58B of the liquid inlet 58 in addition to the upper height position HT.

Figure 10:
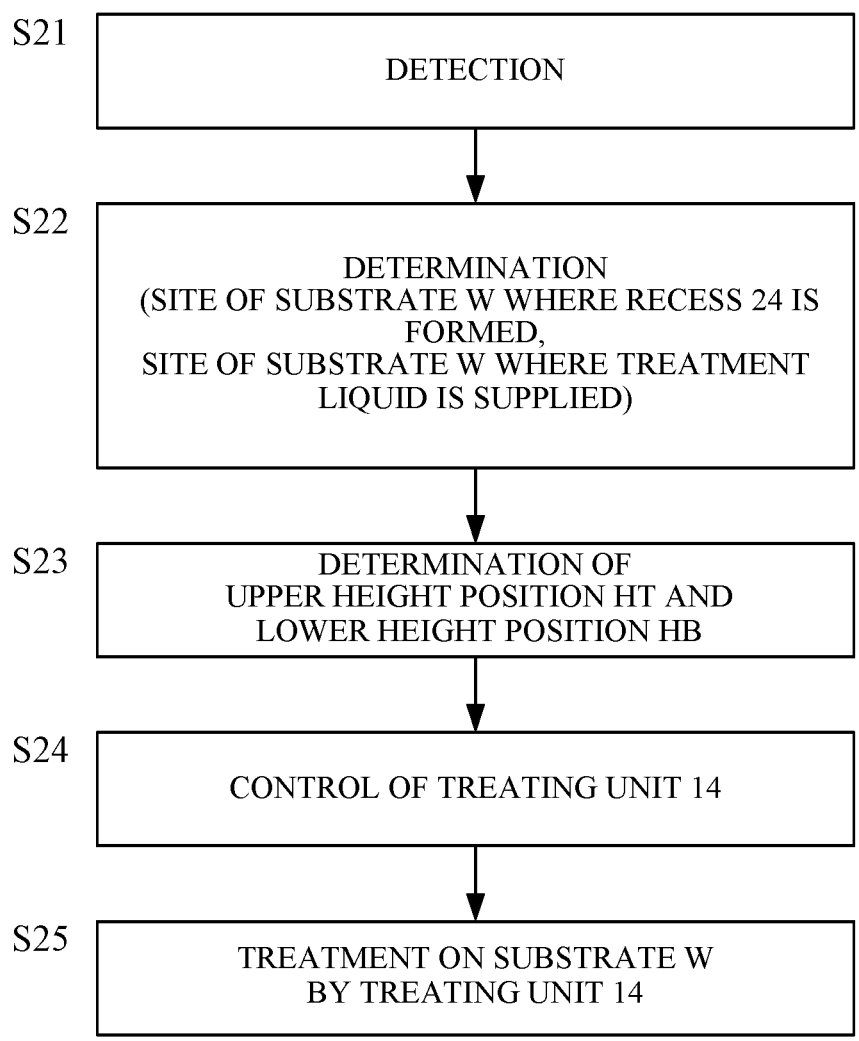
FIG. 10 is a flow chart showing procedures of control by a controller and operation of a treating unit according to the third embodiment.

FIG. 10 is a flow chart showing procedures of control by the controller 18 and operation of the treating unit 14.

Step S21

This step S21 is substantially the same as step S1 in the first embodiment. That is, the barcode reader 4 reads a bar code attached to a carrier C. The shape detectors 13 and 67 each detect a shape of a substrate W. The barcode reader 4 and the shape detectors 13 and 67 output detection results thereof to the controller 18.

Step S22

The controller 18 obtains the detection results from the barcode reader 4 and the shape detectors 13 and 67. The controller 18 determines the shape of the substrate W held by the substrate holder 31 in accordance with the detection results of the barcode readers 4 and the shape detectors 13 and 67. Specifically, the setting unit 18b identifies whether the substrate W, held by the substrate holder 31, has the recess 24 on an upper face of the substrate W. The setting unit 18b identifies whether the substrate W, held by the substrate holder 31, has the recess 24 on a lower face of the substrate W.

The recess 24 formed on the upper face of the substrate W is hereinafter especially called an "upper recess portion 24A". The recess 24 formed on the lower face of the substrate W is hereinafter especially called a "lower recess portion 24B". The upper recess portion 24A is directed upward. The upper recess portion 24A is open upward. The lower recess portion 24B is directed downward. The lower recess portion 24B is open downward.

The controller 18 further identifies whether the treatment liquid supplying unit 41 supplies the treatment liquid to the upper face of the substrate W held by the substrate holder 31. The controller 18 identifies whether the treatment liquid supplying unit 41 supplies the treatment liquid to the lower face of the substrate W held by the substrate holder 31.

Step S23

The controller 18 (specifically, setting unit 18b) determines the upper height position HT in accordance with the shape of the substrate W held by the substrate holder 31.

For example, the memory unit 18a stores in advance a first upper set value VTe, a second upper set value VTf, and a third upper set value VTg. The first upper set value VTe, the second upper set value VTf, and the third upper set value VTg are each a set value about the upper height position HT. The setting unit 18b switches the first upper set value VTe, the second upper set value VTf, and the third upper set value VTg in accordance with the shape of the substrate W held by the substrate holder 31. The setting unit 18b selects one among the first upper set value VTe, the second upper set value VTf, and the third upper set value VTg in accordance with the shape of the substrate W held by the substrate holder 31.

The first upper set value VTe, the second upper set value VTf, and the third upper set value VTg each define the upper height position HT. The upper height position HT defined by the first upper set value VTe is denoted as a first upper height position HTe. The upper height position HT defined by the second upper set value VTf is denoted as a second upper height position HTf. The upper height position HT defined by the third upper set value VTg is denoted as a third upper height position HTg. The first upper height position HTe is higher than the second upper height position HTf. The second upper height position HTf is higher than the third upper height position HTg. Accordingly, selection of the first upper set value VTe by the setting unit 18b corresponds to determination of the first upper height position HTe as a target of the upper height position HT by the controller 18. Selection of the second upper set value VTf by the setting unit 18b corresponds to determination of the second upper height position HTf as the target of the upper height position HT by the controller 18. Selection of the third upper set value VTg by the setting unit 18b corresponds to determination of the third upper height position HTg as the target of the upper height position HT by the controller 18.

The first upper set value VTe, the second upper set value VTf, and the third upper set value VTg are each an example of the set value in the present invention.

The controller 18 takes in consideration of a shape of a substrate W held by the substrate holder 31 for changing the upper height position HT. The shape of the substrate W that the controller 18 considers is, for example, whether the substrate W held by the substrate holder 31 has the upper recess portion 24A. The controller 18 further takes in consideration whether the treatment liquid supplying unit 41 supplies the treatment liquid to the upper face of the substrate W held by the substrate holder 31.

For example, when the substrate W held by the substrate holder 31 has the upper recess portion 24A and when the treatment liquid supplying unit 41 supplies the treatment liquid to the upper face of the substrate W, the first upper set value VTe is determined by the controller 18. When the substrate W held by the substrate holder 31 does not have the upper recess portion 24A and when the treatment liquid supplying unit 41 supplies the treatment liquid to the upper face of the substrate W, the second upper set value VTf is determined by the controller 18. When the treatment liquid supplying unit 41 does not supply the treatment liquid to the upper face of the substrate W, the third upper set value VTg is determined by the controller 18.

Moreover, the controller 18 determines the height position of the lower end 58B of the liquid inlet 58 in accordance with the shape of the substrate W held by the substrate holder 31. The height position of the lower end 58B of the liquid inlet 58 is hereinafter abbreviated to a "lower height position HB".

For example, the memory unit 18*a* stores in advance a first lower set value VBa and a second lower set value VBb. The first lower set value VBa and the second lower set value VBb are each a set value about the lower height position HB. The setting unit 18*b* switches the first lower set value VBa and the second lower set value VBb in accordance with the shape of the substrate W held by the substrate holder 31. The setting unit 18*b* selects either the first lower set value VBa or the second lower set value VBb in accordance with the shape of the substrate W held by the substrate holder 31.

The first lower set value VBa and the second lower set value VBb each define the lower height position HB. The lower height position HB defined by the first lower set value VBa is denoted as a first lower height position HBa. The lower height position HB defined by the second lower set value VBb is denoted as a second lower height position HBb. The first lower height position HBa is lower than the second lower height position HBb. Accordingly, selection of the first lower set value VBa by the setting unit 18*b* corresponds to determination of the first lower height position HBa as a target of the lower height position HB by the controller 18. Selection of the second lower set value VBb by the setting unit 18*b* corresponds to determination of the second lower height position HBb as a target of the lower height position HB by the controller 18.

The first lower set value VBa and the second lower set value VBb are each an example of the set value in the present invention.

The controller 18 takes in consideration of the shape of the substrate W held by the substrate holder 31 for changing the lower height position HB. The shape of the substrate W that the controller 18 considers is, for example, whether the substrate W held by the substrate holder 31 has the lower recess portion 24B. The controller 18 further takes in consideration whether the treatment liquid supplying unit 41 supplies the treatment liquid to the lower face of the substrate W held by the substrate holder 31.

For example, when the substrate W held by the substrate holder 31 has the lower recess portion 24B and when the treatment liquid supplying unit 41 supplies the treatment liquid to the lower face of the substrate W, the first lower set value VBa is determined by the controller 18. When the substrate W held by the substrate holder 31 does not have the lower recess portion 24B, the second lower set value VBb is determined by the controller 18. Also, when the treatment liquid supplying unit 41 does not supply the treatment liquid to the lower face of the substrate W, the second lower set value VBb is determined by the controller 18.

Step S24

The controller 18 controls the treating unit 14. The controller 18 controls the guard driving unit 60 in accordance with the determined upper height position HT and the determined lower height position HB. More specifically, the controller 18 controls the second guard drive mechanism 62 in accordance with the determined upper height position HT. The controller 18 controls the first guard drive mechanism 61 in accordance with the determined lower height position HB.

Specifically, the drive circuit 18*c* drives the guard driving unit 60 in accordance with the switched set value. For example, when the setting unit 18*b* selects the first upper set value VTe, the drive circuit 18*c* outputs a drive command to the second guard drive mechanism 62 in accordance with the first upper set value VTe. For example, when the setting unit 18*b* selects the second upper set value VTf, the drive circuit 18*c* outputs a drive command to the second guard drive mechanism 62 in accordance with the second upper set value VTf. For example, when the setting unit 18*b* selects the third upper set value VTg, the drive circuit 18*c* outputs a drive command to the second guard drive mechanism 62 in accordance with the third upper set value VTg. For example, when the setting unit 18*b* selects the first lower set value VBa, the drive circuit 18*c* outputs a drive command to the first guard drive mechanism 61 in accordance with the first lower set value VBa. For example, when the setting unit 18*b* selects the second lower set value VBb, the drive circuit 18*c* outputs a drive command to the first guard drive mechanism 61 in accordance with the second lower set value VBb.

Step S25

The treating unit 14 performs a treatment on a substrate W in response to control by the controller 18. Specifically, the substrate holder 31 holds the substrate W. The second guard drive mechanism 62 moves the second guard 52 in the vertical direction. Accordingly, the upper end 58T of the liquid inlet 58 is located at one of the first upper height position HTe, the second upper height position HTf, and the third upper height position HTg. The first guard drive mechanism 61 moves the first guard 51 in the vertical direction. Accordingly, the lower end 58B of the liquid inlet 58 is located at either the first lower height position HBa or the second lower height position HBb.

More specifically, when the setting unit 18*b* selects the first upper set value VTe, the upper end 58T of the liquid inlet 58 is located at the first upper height position HTe. When the setting unit 18*b* selects the second upper set value VTf, the upper end 58T of the liquid inlet 58 is located at the second upper height position HTf. When the setting unit 18*b* selects the third upper set value VTg, the upper end 58T of the liquid inlet 58 is located at the third upper height position HTg. When the setting unit 18*b* selects the first lower set value VBa, the lower end 58B of the liquid inlet 58 is located at the first lower height position HBa. When the setting unit 18*b* selects the second lower set value VBb, the lower end 58B of the liquid inlet 58 is located at the second lower height position HBb. In such a manner as above, the controller 18 changes the upper height position HT and the lower height position HB in accordance with the shape of the substrate W held by the substrate holder 31. For example, the controller 18 changes the upper height position HT depending on whether the substrate W held by the substrate holder 31 has the upper recess portion 24A and whether the treatment liquid supplying unit 41 supplies the treatment liquid to the upper face of the substrate W held by the substrate holder 31. For example, the controller 18 changes the lower height position HB depending on whether the substrate W held by the substrate holder 31 has the lower recess portion 24B and whether the treatment liquid supplying unit 41 supplies the treatment liquid to the lower face of the substrate W held by the substrate holder 31.

FIGS. 11(*a*) to 11(*f*) are diagrams each schematically showing the treating unit 14 for treating a substrate W. When the first nozzle 42 does not dispense the treatment liquid, illustration of the first nozzle 42 is omitted in FIGS. 11(*a*) to 11(*f*). Accordingly, the first nozzle 42 does not dispense the treatment liquid in FIGS. 11(*c*) and 11(*f*). When the second nozzle 45 does not dispense the treatment liquid, illustration of the second nozzle 45 is omitted in FIGS. 11(*a*) to 11(*f*). Accordingly, the second nozzle 45 does not dispense the treatment liquid in FIGS. 11(*a*) and 11(*d*).

Reference is now made to FIGS. 11(*a*) and 11(*b*). When the substrate W held by the substrate holder 31 has the upper recess portion 24A and when the treatment liquid supplying unit 41 supplies the treatment liquid to the upper face of the substrate W, the upper end 58T of the liquid inlet 58 is located at the first upper height position HTe (i.e., upper height position HT defined by the first upper set value VTe).

Figure 11A:
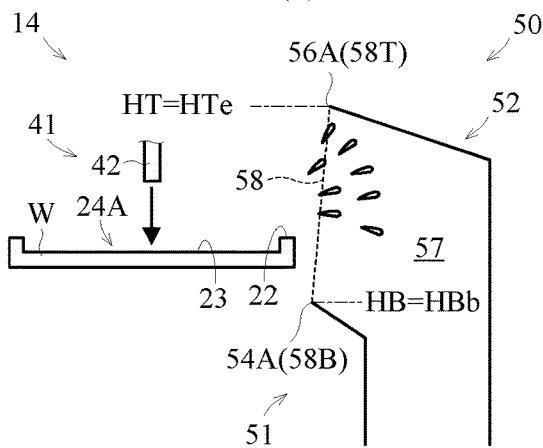
FIG. 11(a) to FIG. 11(f) are diagrams each schematically showing the treating unit.
Figure 11D:
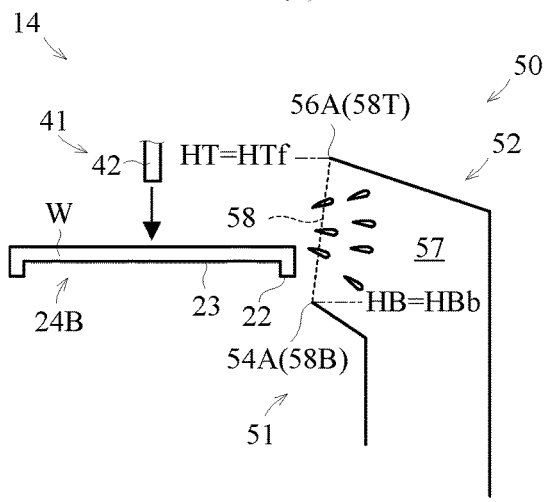
Figure 11B:
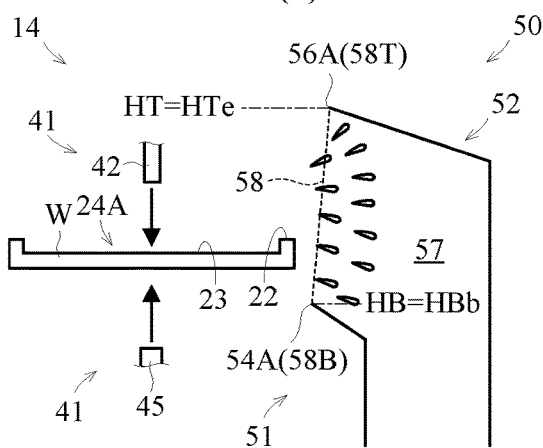
Figure 11E:
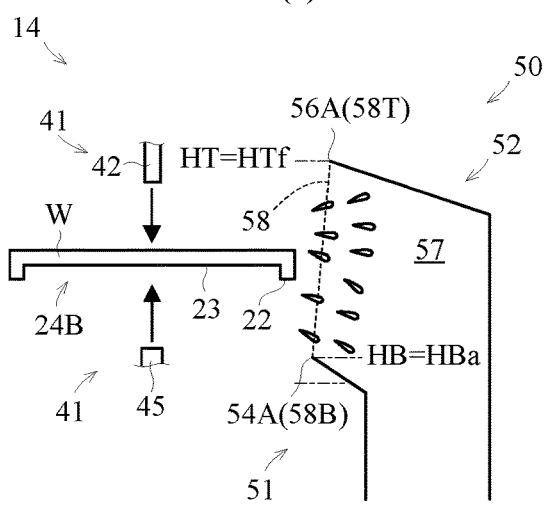

Reference is now made to FIGS. 11(d) and 11(e). When the substrate W held by the substrate holder 31 does not have the upper recess portion 24A and when the treatment liquid supplying unit 41 supplies the treatment liquid to the upper face of the substrate W, the upper end 58T of the liquid inlet 58 is located at the second upper height position HTf (i.e., upper height position HT defined by the second upper set value VTf).

Figure 11C:
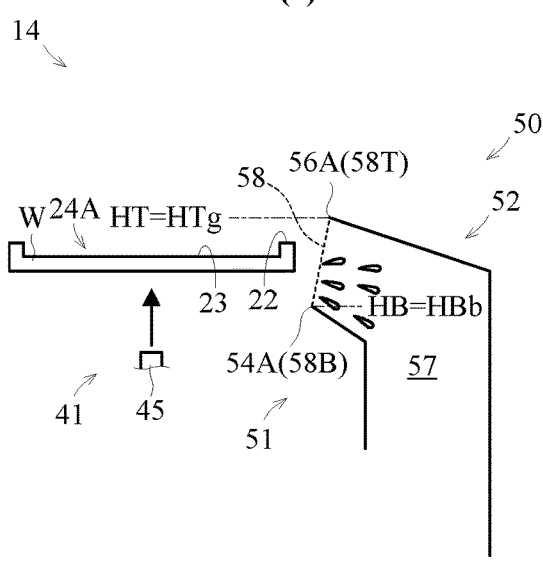
Figure 11F:
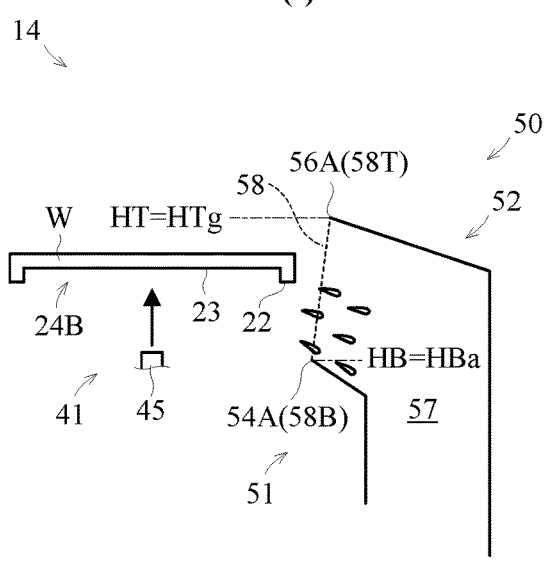

Reference is now made to FIGS. 11(c) and 11(f). When the treatment liquid supplying unit 41 does not supply the treatment liquid to the upper face of the substrate W, the upper end 58T of the liquid inlet 58 is located at the third upper height position HTg (i.e., upper height position HT defined by the third upper set value VTg).

Reference is now made to FIGS. 11(e) and 11(f). When the substrate W held by the substrate holder 31 has the lower recess portion 24B and when the treatment liquid supplying unit 41 supplies the treatment liquid to the lower face of the substrate W, the lower end 58B of the liquid inlet 58 is located at the first lower height position HBa (i.e., lower height position HB defined by the first lower set value VBa).

Reference is now made to FIGS. 11(a), 11(b), and 11(c). When the substrate W held by the substrate holder 31 does not have the lower recess portion 24B, the lower end 58B of the liquid inlet 58 is located at the second lower height position HBb (i.e., lower height position HB defined by the second lower set value VBb).

Reference is now made to FIGS. 11(a) and 11(d). When the treatment liquid supplying unit 41 does not supply the treatment liquid to the lower face of the substrate W, the lower end 58B of the liquid inlet 58 is located at the second lower height position HBb.

As illustrated, the first upper height position HTe is higher than the second upper height position HTf. The second upper height position HTf is higher than the third upper height position HTg. The first lower height position HBa is lower than the second lower height position HBb.

Subsequently, the treatment liquid supplying unit 41 supplies the treatment liquid to the substrate W held by the substrate holder 31 while the rotation driving unit 35 rotates the substrate holder 31. The liquid collecting unit 50 collects the treatment liquid scattered from the substrate W.

Reference is now made to FIGS. 11(a) to 11(c). When the substrate W held by the substrate holder 31 has the upper recess portion 24A, the upper face of the substrate W at the peripheral portion 22 is positioned higher than the upper face of the substrate W at the main portion 23.

Reference is now made to FIGS. 11(d) to 11(f). When the substrate W held by the substrate holder 31 does not have the upper recess portion 24A, the upper face of the substrate W is substantially flat. More specifically, the upper face of the substrate W at the peripheral portion 22 is located at substantially the same height position as the upper face of the substrate W at the main portion 23.

Reference is now made to FIGS. 11(a), 11(b), 11(d) and 11(e). When the treatment liquid supplying unit 41 supplies the treatment liquid to the upper face of the substrate W held by the substrate holder 31, the treatment liquid flows along the upper face of the substrate W from the main portion 23 to the peripheral portion 22.

Reference is now made to FIGS. 11(a) and 11(b). When the substrate W held by the substrate holder 31 has the upper recess portion 24A and when the treatment liquid supplying unit 41 supplies the treatment liquid to the upper face of the substrate W held by the substrate holder 31, the treatment liquid flows upward along the upper face of the substrate W from the main portion 23 to the peripheral portion 22. Consequently, the treatment liquid is easily scattered upward from the substrate W. The treatment liquid is easily scattered from the substrate W to a high position. The upper end 58T of the liquid inlet 58 is located at the first upper height position HTe. The first upper height position HTe is relatively high. Accordingly, the liquid inlet 58 can introduce the treatment liquid into the collecting space 57 suitably.

Reference is now made to FIGS. 11(d) and 11(e). When the substrate W held by the substrate holder 31 does not have the upper recess portion 24A and when the treatment liquid supplying unit 41 supplies the treatment liquid to the upper face of the substrate W held by the substrate holder 31, the treatment liquid flows substantially horizontally along the upper face of the substrate W from the main portion 23 to the peripheral portion 22. Consequently, the treatment liquid is hard to be scattered upward from the substrate W. The treatment liquid is hard to be scattered from the substrate W to a high position. The upper end 58T of the liquid inlet 58 is located at the second upper height position HTf. The second upper height position HTf is lower than the first upper height position HTe. Accordingly, the liquid inlet 58 can introduce the treatment liquid into the collecting space 57 suitably.

Reference is now made to FIGS. 11(c) and 11(f). When the treatment liquid supplying unit 41 does not supply the treatment liquid to the upper face of the substrate W held by the substrate holder 31, the treatment liquid does not flow along the upper face of the substrate W. Consequently, the treatment liquid is harder to be scattered upward from the substrate W. The treatment liquid is harder to be scattered from the substrate W to a high position. The upper end 58T of the liquid inlet 58 is located at the third upper height position HTg. The third upper height position HTg is lower than the first upper height position HTe. Moreover, the third upper height position HTg is lower than the second upper height position HTf. Accordingly, the liquid inlet 58 can introduce the treatment liquid into the collecting space 57 suitably.

Reference is now made to FIGS. 11(d) to 11(f). When the substrate W held by the substrate holder 31 has the lower recess portion 24B, the lower face of the substrate W at the peripheral portion 22 is positioned lower than the lower face of the substrate W at the main portion 23.

Reference is now made to FIGS. 11(a) to 11(c). When the substrate W held by the substrate holder 31 does not have the lower recess portion 24B, the lower face of the substrate W is substantially flat. More specifically, the lower face of the substrate W at the peripheral portion 22 is located at substantially the same height position as the lower face of the substrate W at the main portion 23.

Reference is now made to FIGS. 11(b), 11(c), 11(e) and 11(f). When the treatment liquid supplying unit 41 supplies the treatment liquid to the lower face of the substrate W held by the substrate holder 31, the treatment liquid flows along the lower face of the substrate W from the main portion 23 to the peripheral portion 22.

Reference is now made to FIGS. 11(e) and 11(f). When the substrate W held by the substrate holder 31 has the lower recess portion 24B and when the treatment liquid supplying unit 41 supplies the treatment liquid to the lower face of the substrate W held by the substrate holder 31, the treatment liquid flows downward along the lower face of the substrate W from the main portion 23 to the peripheral portion 22. Consequently, the treatment liquid is easily scattered downward from the substrate W. The treatment liquid is easily scattered from the substrate W to a low position. The lower end 58B of the liquid inlet 58 is located at the first lower height position HBa. The first lower height position HBa is relatively low. Accordingly, the liquid inlet 58 can introduce the treatment liquid into the collecting space 57 suitably.

Reference is now made to FIGS. 11(b) and 11(c). When the substrate W held by the substrate holder 31 does not have the lower recess portion 24B and when the treatment liquid supplying unit 41 supplies the treatment liquid to the lower face of the substrate W held by the substrate holder 31, the treatment liquid flows substantially horizontally along the lower face of the substrate W from the main portion 23 to the peripheral portion 22. Consequently, the treatment liquid is hard to be scattered downward from the substrate W. The treatment liquid is hard to be scattered from the substrate W to a low position. The lower end 58B of the liquid inlet 58 is located at the second lower height position HBb. The second lower height position HBb is higher than the first lower height position HBa. Accordingly, the liquid inlet 58 can introduce the treatment liquid into the collecting space 57 suitably.

Reference is now made to FIGS. 11(a) and 11(d). When the treatment liquid supplying unit 41 does not supply the treatment liquid to the lower face of the substrate W held by the substrate holder 31, the treatment liquid does not flow along the lower face of the substrate W. Consequently, the treatment liquid is harder to be scattered downward from the substrate W. The treatment liquid is harder to be scattered from the substrate W to a low position. The lower end 58B of the liquid inlet 58 is located at the second lower height position HBb. The second lower height position HBb is higher than the first lower height position HBa. Accordingly, the liquid inlet 58 can introduce the treatment liquid into the collecting space 57 suitably.

Effect of Third Embodiment

The controller 18 controls the guard driving unit 60 in accordance with the shape of the substrate W held by the substrate holder 31, thereby changing the upper height position HT also in the third embodiment, which feature is similar to the first embodiment. Moreover, the controller 18 controls the guard driving unit 60 in accordance with the shape of the substrate W held by the substrate holder 31, thereby changing the lower height position HB in the third embodiment. Consequently, the liquid inlet 58 can be adjusted to be located at a more appropriate height position in accordance with the shape of the substrate W held by the substrate holder 31. This can cause the liquid collecting unit 50 to collect the treatment liquid scattered from the substrate W more suitably regardless of the shape of the substrate W held by the substrate holder 31. As a result, the treating unit 14 can treat the substrate W more suitably. That is, the substrate treating apparatus 1 can treat substrates W more suitably.

The memory unit 18a is configured to store the first upper set value VTe, the second upper set value VTf, and the third upper set value VTg. The setting unit 18b is configured to switch among the first upper set value VTe, the second upper set value VTf, and the third upper set value VTg in accordance with the shape of the substrate W held by the substrate holder 31. The memory unit 18a is configured to store the first lower set value VBa and the second lower set value VBb. The setting unit 18b is configured to switch among the first lower set value VBa and the second lower set value VBb in accordance with the shape of the substrate W held by the substrate holder 31. Accordingly, the controller 18 can determine both the upper height position HT and the lower height position HB suitably. Consequently, the controller 18 can change the upper height position HT and the lower height position HB suitably in accordance with the shape of the substrate W held by the substrate holder 31.

The treating unit 14 performs a treatment to the substrate W (S25). The treating unit 14 performs the treatment on the substrate W with a treating method including three steps. A first step is made by holding a substrate W by the substrate holder 31 in a horizontal posture. A second step is made by moving the first guard 51 and the second guard 52 in the vertical direction in accordance with the shape of the substrate W held by the substrate holder 31, thereby changing the upper height position HT and the lower height position HB. A third step is made by rotating the substrate holder 31 for supplying the treatment liquid to the substrate W held by the substrate holder 31 and receiving the treatment liquid, passing through the liquid inlet 58, with the first guard 51 and the second guard 52. As a result, the treating unit 14 can treat the substrate W more suitably.

It is a matter that affects a direction of the treatment liquid scattered from the substrate W whether the substrate W held by the substrate holder 31 has the upper recess portion 24A. It is also a matter that affects a direction of the treatment liquid scattered from the substrate W whether the treatment liquid supplying unit 41 supplies the treatment liquid to the upper face of the substrate W held by the substrate holder 31. The controller 18 changes the upper height position HT in consideration of both of the above matters. This can cause the controller 18 to adjust the upper end 58T of the liquid inlet 58 to be located at an appropriate height position. This can cause the liquid collecting unit 50 to collect the treatment liquid scattered from the substrate W suitably.

When the substrate W held by the substrate holder 31 has the upper recess portion 24A and when the treatment liquid supplying unit 41 supplies the treatment liquid to the upper face of the substrate W held by the substrate holder 31, the upper end 58T of the liquid inlet 58 is located at the first upper height position HTe. When the substrate W held by the substrate holder 31 does not have the upper recess portion 24A, the upper end 58T of the liquid inlet 58 is located at either the second upper height position HTf or the third upper height position HTg. When the liquid supplying unit 41 does not supply the treatment liquid to the upper face of the substrate W held by the substrate holder 31, the upper end 58T of the liquid inlet 58 is located at the third upper height position HTg. The first upper height position HTe is higher than the second upper height position HTf and the third upper height position HTg. Accordingly, when the substrate W held by the substrate holder 31 has the upper recess portion 24A and when the treatment liquid supplying unit 41 supplies the treatment liquid to the upper face of the substrate W held by the substrate holder 31, the liquid collecting unit 50 can collect the treatment liquid scattered from the substrate W suitably. The liquid collecting unit 50 can collect the treatment liquid scattered from the substrate W suitably even when the substrate W held by the substrate holder 31 does not have the upper recess portion 24A. The liquid collecting unit 50 can collect the treatment liquid scattered from the substrate W suitably even when the liquid supplying unit 41 does not supply the treatment liquid to the upper face of the substrate W held by the substrate holder 31.

When the treatment liquid supplying unit 41 does not supply the treatment liquid to the upper face of the substrate W held by the substrate holder 31, the upper end 58T of the liquid inlet 58 is located at the third upper height position HTg. When the treatment liquid supplying unit 41 supplies the treatment liquid to the upper face of the substrate W held by the substrate holder 31, the upper end 58T of the liquid inlet 58 is located at the first upper height position HTe or the second upper height position HTf. The third upper height position HTg is lower than the first upper height position HTe and the second upper height position HTf. Accordingly, the liquid collecting unit 50 can collect the treatment liquid scattered from the substrate W more suitably when the treatment liquid supplying unit 41 does not supply the treatment liquid to the upper face of the substrate W held by the substrate holder 31.

It is a matter that largely affects a direction of the treatment liquid scattered from the substrate W whether the substrate W held by the substrate holder 31 has the lower recess portion 24B. It is also a matter that largely affects a direction of the treatment liquid scattered from the substrate W whether the treatment liquid supplying unit 41 supplies the treatment liquid to the lower face of the substrate W held by the substrate holder 31. The controller 18 changes the lower height position HB in consideration of both of the above matters. This can cause the controller 18 to adjust the lower end 58B of the liquid inlet 58 to be located at an appropriate height position. This can cause the liquid collecting unit 50 to collect the treatment liquid scattered from the substrate W suitably.

When the substrate W held by the substrate holder 31 has the lower recess portion 24B and when the treatment liquid supplying unit 41 supplies the treatment liquid to the lower face of the substrate W held by the substrate holder 31, the lower end 58B of the liquid inlet 58 is located at the first lower height position HBa. When the substrate W held by the substrate holder 31 does not have the lower recess portion 24B, the lower end 58B of the liquid inlet 58 is located at the second lower height position HBb. When the liquid supplying unit 41 does not supply the treatment liquid to the lower face of the substrate W held by the substrate holder 31, the lower end 58B of the liquid inlet 58 is located at the second lower height position HBb. The first lower height position HBa is lower than the second lower height position HBb. Accordingly, when the substrate W held by the substrate holder 31 has the lower recess portion 24B and when the treatment liquid supplying unit 41 supplies the treatment liquid to the lower face of the substrate W held by the substrate holder 31, the liquid collecting unit 50 can collect the treatment liquid scattered from the substrate W suitably. The liquid collecting unit 50 can collect the treatment liquid scattered from the substrate W suitably even when the substrate W held by the substrate holder 31 does not have the lower recess portion 24B. The liquid collecting unit 50 can collect the treatment liquid scattered from the substrate W suitably even when the liquid supplying unit 41 does not supply the treatment liquid to the lower face of the substrate W held by the substrate holder 31.

The present invention is not limited to the foregoing first, second, and third embodiments, but may be modified as follows.

In the first and second embodiments, the controller 18 changes the upper height position HT. In the third embodiment, the controller 18 changes the upper height position HT and the lower height position HB. However, the present invention is not limited to this. The controller 18 may change at least either the upper height position HT or the lower height position HB.

In the first, second and third embodiments, the thickness of the main portion 23, presence or absence of the recess 24, the site of the substrate W where the recess 24 is located, and the site of the substrate where the treatment liquid is supplied are exemplarily described as a factor of changing the height position of the liquid inlet 58. However, the present invention is not limited to this. For example, the factor of changing the height position of the liquid inlet 58 may be a size of the recess 24 or a shape of the recess 24. For example, the shape of the substrate W that the controller 18 considers for changing at least either the upper height position HT or the lower height position HB may be the size of the recess 24 or the shape of the recess 24. For example, the controller 18 may change the height position of the liquid inlet 58 in accordance with the size of the recess 24 or the shape of the recess 24.

Figure 12:
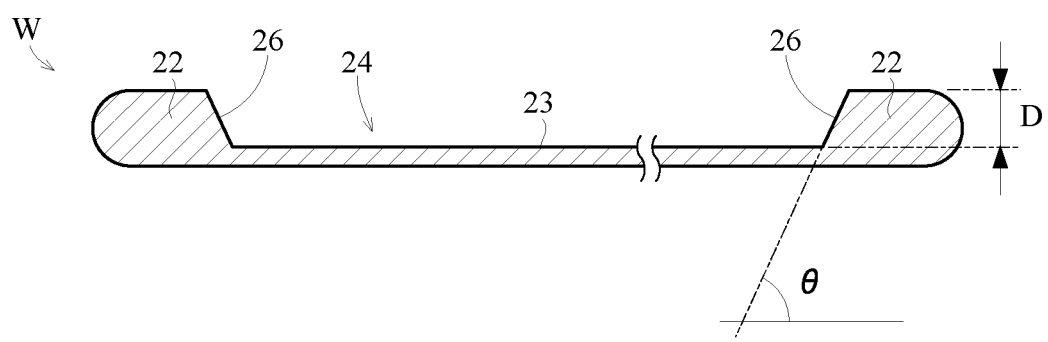
FIG. 12 is a cross sectional view of a substrate.

FIG. 12 is a cross sectional view of a substrate W. The controller 18 may change at least either the upper height position HT or the lower height position HB in accordance with a depth D. Here, the depth D is a depth of the main portion 23 relative to the peripheral portion 22. More specifically, the depth D corresponds to a difference in height position between the peripheral portion 22 and the main portion 23. The depth D may also be called a "depth of the recess 24". The depth D is a matter that affects a direction of the treatment liquid scattered from the substrate W. For example, an upper end 58T of the liquid inlet 58 when the substrate W held by the substrate holder 31 has a first depth D1 may be higher than an upper end 58 of the liquid inlet 58 when the substrate W held by the substrate holder 31 has a second depth D2 smaller than the first depth D1. For example, the upper height position HT may be higher as the depth D becomes larger. With the present modification, the liquid collecting unit 50 can collect the treatment liquid scattered from the substrate W suitably regardless of the depth D of the recess 24.

Reference is made to FIG. 12. The substrate W includes a recess 24 and a wall 26. The wall 26 is formed between the peripheral portion 22 and the main portion 23. More specifically, the wall 26 extends from an inner edge of the peripheral portion 22 to an outer edge of the main portion 23. When the substrate W is not bent, the peripheral portion 22 and the main portion 23 are horizontal whereas the wall 26 is not horizontal. The controller 18 may change at least either the upper height position HT or the lower height position HB in accordance with an angle θ of the wall 26. Here, the angle θ of the wall 26 is an angle of the wall 26 relative to a horizontal line, for example. The angle of the wall 26 is a matter that affects a direction of the treatment liquid scattered from the substrate W. For example, an upper end 58T of the liquid inlet 58 when the wall 26 of the substrate W held by the substrate holder 31 is inclined at a first angle may be higher than an upper end 58 of the liquid inlet 58 when the wall 26 of the substrate W held by the substrate holder 31 is inclined at a second angle smaller the first angle. For example, the upper height position HT may be higher as the angle of the wall 26 becomes larger. According to the present modification, the liquid collecting unit 50 can collect the treatment liquid scattered from the substrate W suitably regardless of the angle θ of the wall 26.

In the first and second embodiments, the guard driving unit 60 moves only the second guard 52. However, the present invention is not limited to this. The guard driving unit 60 may move at least either the first guard 51 or the second guard 52. For example, the guard driving unit 60 may move the first guard 51. This can cause the controller 18 to change the lower height position HB.

In the first, second, and third embodiments, the number of guards of the liquid collecting unit 50 is two. However, the present invention is not limited to this. The liquid collecting unit 50 may include three or more guards.

Figure 13:
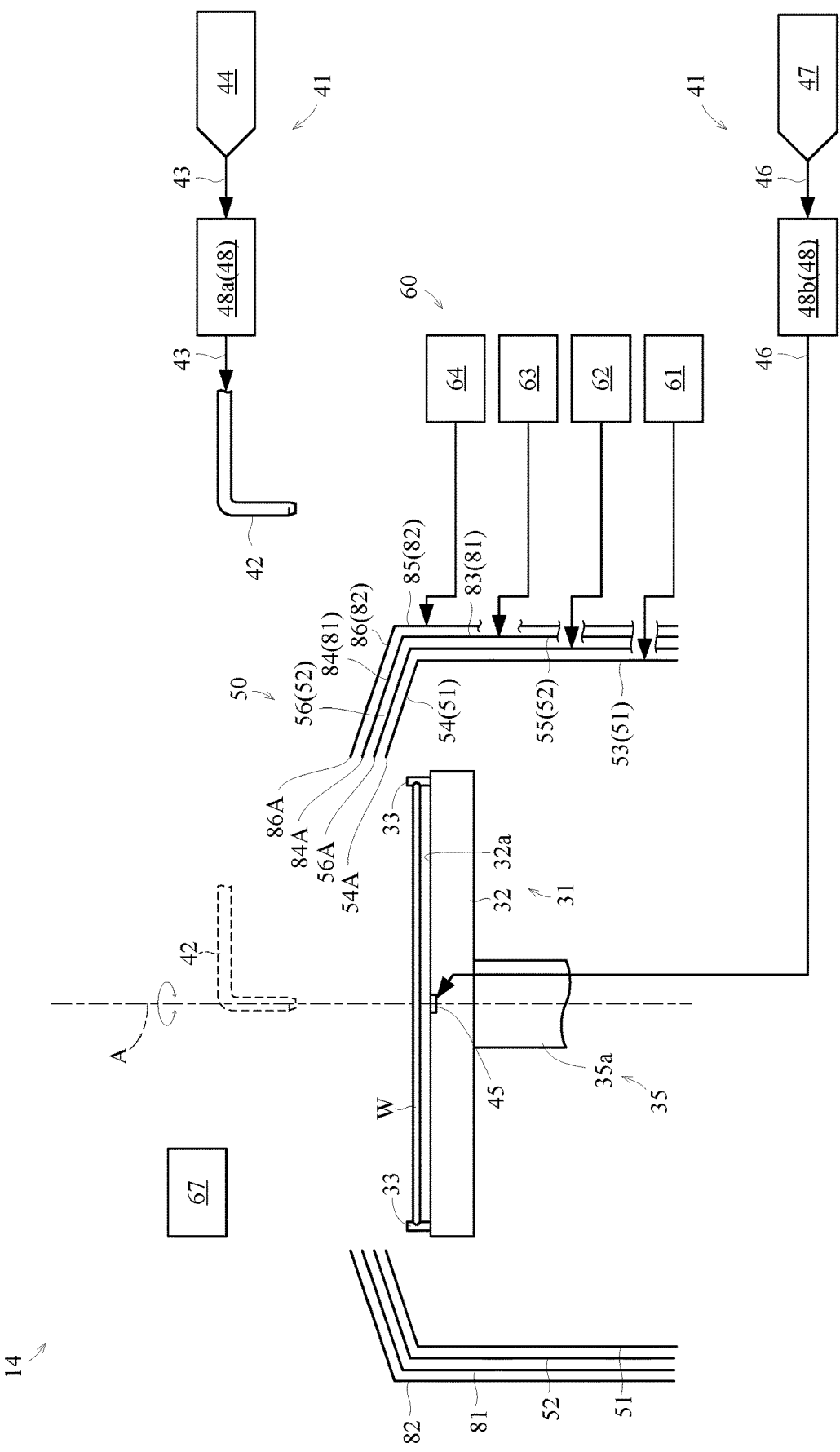
FIG. 13 is a diagram schematically showing a treating unit according to one modification.
Figure 14A:
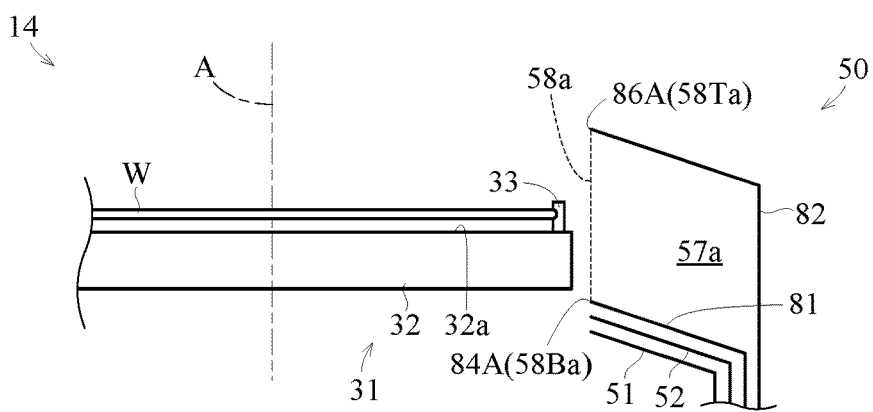
FIG. 14(a) to FIG. 14(d) are diagrams each showing an arrangement example of guards.
Figure 14B:
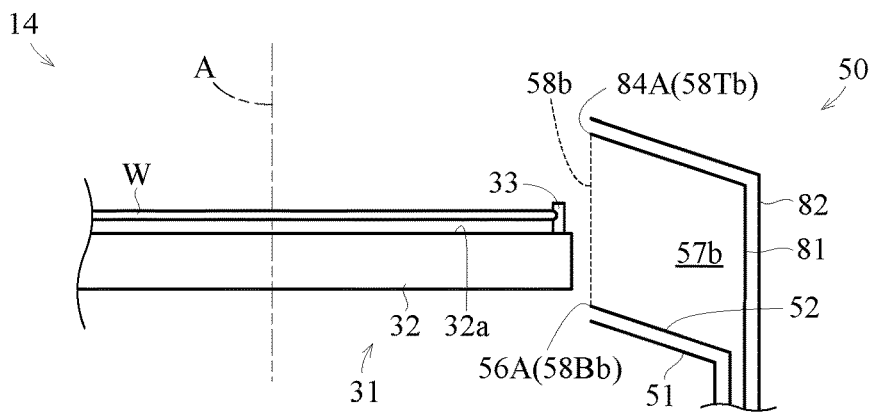
Figure 14C:
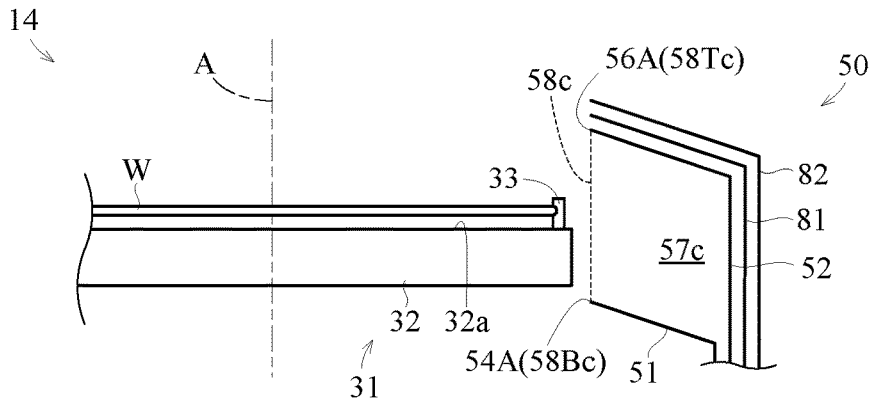
Figure 14D:
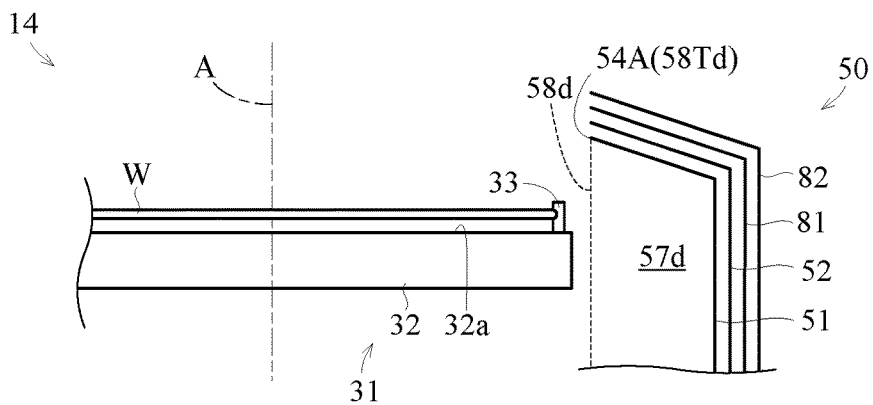

FIG. 13 is a diagram schematically showing a treating unit 14 according to another modification. Like numerals are used to identify like components which are the same as those in the first embodiment, and the components will not particularly be described.

In the treating unit 14 according to this modification, the liquid collecting unit 50 includes a third guard 81 and a fourth guard 82 in addition to a first guard 51 and a second guard 52. third guard 81 and the fourth guard 82 each receive a treatment liquid. The third guard 81 and the fourth guard 82 are each arranged so as to surround the substrate holder 31 laterally. The third guard 81 and the fourth guard 82 each have a substantially cylindrical shape with the rotation axis A as the center. The third guard 81 is located outward of the second guard 52. The fourth guard 82 is located outward of the third guard 81.

The third guard 81 and the fourth guard 82 have substantially the same configuration as the first guard 51 and second guard 52, respectively. That is, the third guard 81 has a vertical portion 83 and a slope portion 84. The vertical portion 83 is located outward of the vertical portion 55. The slope portion 84 is located above the slope portion 56. The slope portion 84 has an upper edge 84A. The fourth guard 82 has a vertical portion 85 and a slope portion 86. The vertical portion 85 is located outward of the vertical portion 83. The slope portion 86 is located above the slope portion 84. The slope portion 86 has an upper edge 86A.

The first guard 51, the second guard 52, the third guard 81, and the fourth guard 82 are each one example of the guards in the present invention.

The guard driving unit 60 includes a third guard drive mechanism 63 and a fourth guard drive mechanism 64 in addition to the first guard drive mechanism 61 and the second guard drive mechanism 62. The third guard drive mechanism 63 moves the third guard 81 in the vertical direction. The fourth guard drive mechanism 64 moves the fourth guard 82 in the vertical direction. The first guard 51, the second guard 52, the third guard 81, and the fourth guard 82 are movable independently of each other in the vertical direction. Note that an upper edge 54A of a slope portion 54 of the first guard 51 is always lower than an upper edge 56A of the slope portion 56 of the second guard 52. The upper edge 56A of the slope portion 56 of the second guard 52 is always lower than the upper edge 84A of the slope portion 84 of the third guard 81. The upper edge 84A of the slope portion 84 of the third guard 81 is always lower than the upper edge 86A of the slope portion 86 of the fourth guard 82.

FIG. 14(*a*) to FIG. 14(*d*) each show an arrangement example of guards. FIG. 14(*a*) to FIG. 14(*d*) omit illustration of the treatment liquid supplying unit 41, the guard driving unit 60, and the like.

Reference is now made to FIG. 14(*a*). The upper edge 86A is located at a position higher than the substrate W held by the substrate holder 31. The upper edges 84A, 56A, and 54A are located at a position lower than the top face 32*a* of the plate 32. The third guard 81 and the fourth guard 82 define a collecting space 57*a* and a liquid inlet 58*a*. The fourth guard 82 defines an upper end 58Ta of the liquid inlet 58*a*. The upper edge 86A of the fourth guard 82 corresponds to the upper end 58Ta of the liquid inlet 58*a*. The third guard 81 defines a lower end 58Ba of the liquid inlet 58*a*. The upper edge 84A of the third guard 81 corresponds to the lower end 58Ba of the liquid inlet 58*a*.

Reference is now made to FIG. 14(*b*). The upper edges 86A and 84A are located at a position higher than the substrate W held by the substrate holder 31. The upper edges 56A and 54A are located at a position lower than the top face 32*a* of the plate 32. The second guard 52 and the third guard 81 define a collecting space 57*b* and a liquid inlet 58*b*. The third guard 81 defines an upper end 58Tb of the liquid inlet 58*b*. The upper edge 84A of the third guard 81 corresponds to the upper end 58Tb of the liquid inlet 58*b*. The second guard 52 defines a lower end 58Bb of the liquid inlet 58*b*. The upper edge 56A of the second guard 52 corresponds to the lower end 58Bb of the liquid inlet 58*b*.

Reference is now made to FIG. 14(*c*). The upper edges 86A, 84A, and 56A are located at a position higher than the substrate W held by the substrate holder 31. The upper edge 54A is located at a position lower than the top face 32*a* of the plate 32. The first guard 51 and the second guard 52 define a collecting space 57*c* and a liquid inlet 58*c*. The second guard 52 defines an upper end 58Tc of the liquid inlet 58*c*. The upper edge 56A of the second guard 52 corresponds to the upper end 58Tc of the liquid inlet 58*c*. The first guard 51 defines a lower end 58Bc of the liquid inlet 58*c*. The upper edge 54A of the first guard 51 corresponds to the lower end 58Bc of the liquid inlet 58*c*.

Reference is now made to FIG. 14(*d*). The upper edges 86A, 84A, 56A, and 54A are located at a position higher than the substrate W held by the substrate holder 31. The first guard 51 defines a collecting space 57*d* and a liquid inlet 58*d*. The collecting space 57*d* is located below the slope portion 54 of the first guard 51 and inward of the vertical portion 53 of the first guard 51. The first guard 51 defines an upper end 58Td of the liquid inlet 58*d*. The upper edge 54A of the first guard 51 corresponds to the upper end 58Td of the liquid inlet 58*d*. On the other hand, none of the first guard 51, the second guard 52, the third guard 81, nor the fourth guard 82 defines the lower end 58Bd of the liquid inlet 58*d*.

The liquid inlets 58*a*, 58*b*, 58*c*, and 58*d* are collectively called a liquid inlet 58 as appropriate. The upper ends 58Ta, 58Tb, 58Tc, and 58Td are collectively called an upper end 58T as appropriate. The lower ends 58Ba, 58Bb, 58Bc, and 58Bd are collectively called a lower end 58B as appropriate.

As described above, the guard defining the upper end 58T of the liquid inlet 58 may switch among the first guard 51, the second guard 52, the third guard 81, and the fourth guard 82. The guard defining the lower end 58B of the liquid inlet 58 may also switch among the first guard 51, the second guard 52, and the third guard 81. The lower end 58B of the liquid inlet 58 may not be defined by the guards.

According to the present modification, the liquid inlet 58 switches among the liquid inlets 58*a*, 58*b*, 58*c*, and 58*d*. Accordingly, the treatment liquid scattered from the substrate W can be collected with use of one selected from a plurality of liquid inlets 58*a*, 58*b*, 58*c*, and 58*d*. The collecting space 57 switches among the collecting spaces 57*a*, 57*b*, 57*c*, and 57*d*. Accordingly, the treatment liquid scattered from the substrate W can be collected with use of one selected from a plurality of collecting spaces 57*a*, 57*b*, 57*c*, and 57*d*. Consequently, when the treatment liquid supplying unit 41 uses a plurality of types of treatment liquids, the liquid collecting unit 50 can collect the plurality of types of treatment liquids separately.

In the first embodiment described above, the upper height position HT is selected from two height positions (specifically, first upper height position HTa and second upper height position HTb). In other words, the upper height position HT changes in two stages in the first embodiment described above. However, the present invention is not limited to this. The upper height position HT may be selected from three or more height positions. In other words, the upper height position HT may change in three or more stages. Alternatively, the upper height position HT may change continuously. For example, the upper height position HT may be higher as the thickness of the main portion 23 becomes smaller. The lower height position HB may be determined and adjusted in the same manner.

In the first, second, and third embodiments described above, the substrate holder 31 includes the edge contact pin 33. However, the present invention is not limited to this. For example, the edge contact pin 33 may be omittable from the substrate holder 31. For example, the substrate holder 31 may hold a substrate W with use of a so-called Bernoulli chuck or a Bernoulli gripper, for example.

Figure 15:
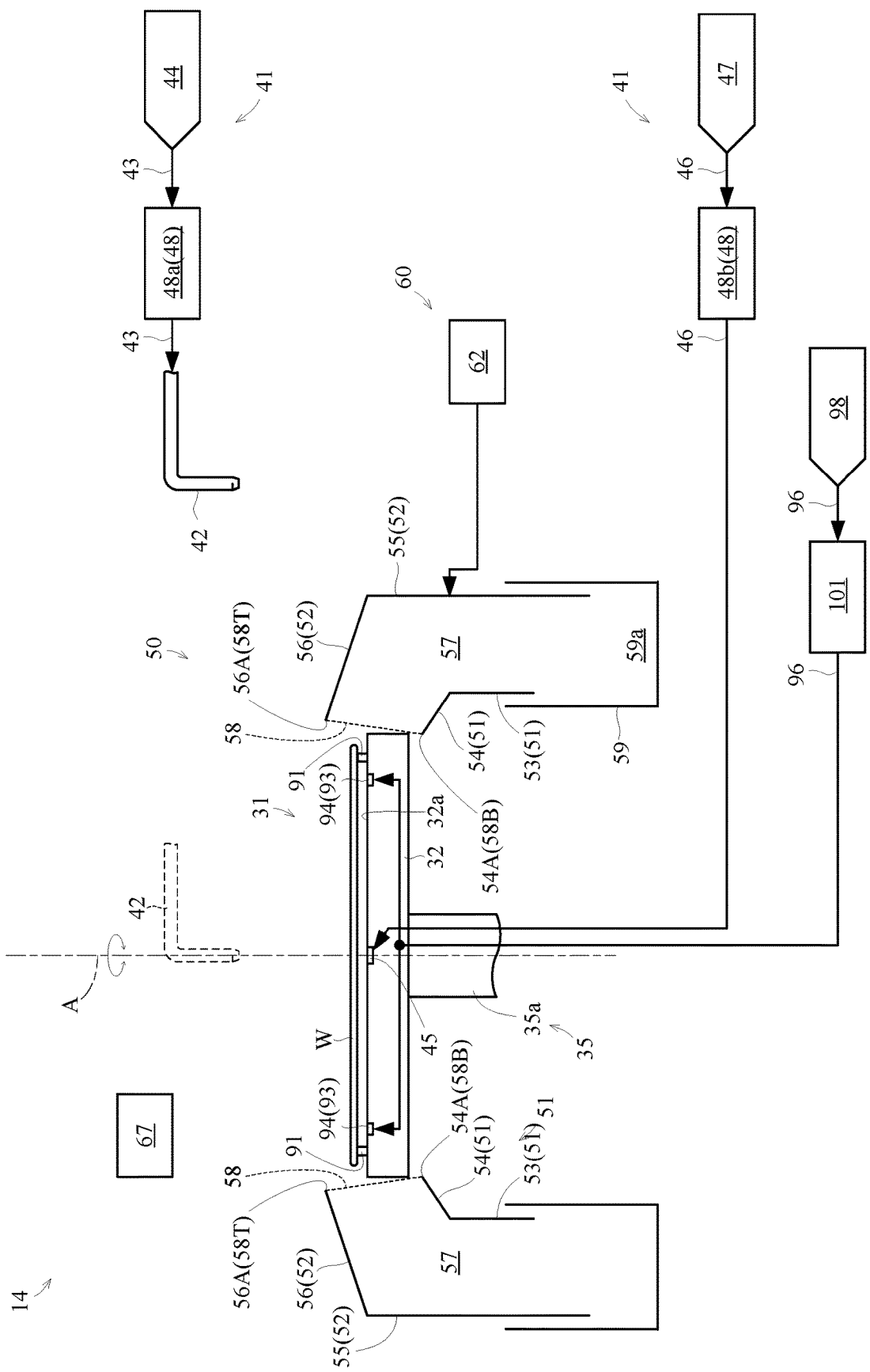
FIG. 15 is a diagram schematically showing a treating unit according to another modification.

FIG. 15 is a diagram schematically showing a treating unit 14 according to another modification. Like numerals are used to identify like components which are the same as those in the first embodiment, and the components will not particularly be described.

The substrate holder 31 further includes a plurality of fixed pins 91. The fixed pins 91 support the substrate W. The fixed pins 91 are each fixed to the plate 32. The fixed pins 91 are immovable relative to the plate 32. The fixed pins 91 are unrotatable relative to the plate 32. The fixed pins 91 each do not have a movable part that is movable relative to the plate 32.

The fixed pins 91 protrude upward from the top face 32a of the plate 32. The fixed pins 91 contact a lower face of the substrate W. More specifically, the fixed pins 91 contact the lower face at the peripheral portion 22 of the substrate W. This causes the fixed pins 91 to support the substrate W at a position higher than the top face 32a of the plate 32. The substrate W supported by the fixed pins 91 is positioned higher than the top face 32a.

The fixed pins 91 do not contact an upper face of the substrate W. The fixed pins 91 allow the substrate W to move upward relative to the fixed pins 91. The fixed pins 91 do not contact an edge of the substrate W. The fixed pins 91 allow the substrate W to slide with respect to the fixed pins 91. In such a manner as above, the fixed pins 91 do not hold the substrate W.

The substrate holder 31 includes a gas outlet 93. The gas outlet 93 is formed on the top face 32a of the plate 32. The gas outlet 93 is located so as to overlap the substrate W supported by the fixed pins 91 in plan view. The gas outlet 93 is configured to blow gas upward. The gas outlet 93 is configured to blow gas between the top face 32a of the plate 32 and the lower face of the substrate W supported by the fixed pins 91. The gas outlet 93 blows the gas to the substrate W from a position below the substrate W supported by the fixed pins 91. The gas is supplied between the top face 32a of the plate 32 and the lower face of the substrate W supported by the fixed pins 91. The gas flows along the lower face of the substrate W supported by the fixed pins 91. Thus, the gas outlet 93 sucks the substrate W. Specifically, a negative pressure is formed by the gas flowing along the lower face of the substrate W. That is, the air pressure on the lower face of the substrate W is less than the air pressure on the upper face of the substrate W. With the Bernoulli's principle, a downward force acts on the substrate W. That is, the substrate W is sucked downward. The substrate W is sucked toward the gas outlet 93 and the plate 32. A suction force acting on the substrate W increases as a flow rate of the gas blown from the gas outlet 93 increases. However, the gas outlet 93 does not contact the substrate W. The plate 32 also does not contact the substrate W.

The gas outlet 93 sucks the substrate W downward and the fixed pins 91 contact the lower face of the substrate W, whereby the substrate W is supported and held in a given position. Due to the suction force acting on the substrate W, the substrate W does not slide in the horizontal direction with respect to the fixed pins 91. In such a manner as above, the substrate holder 31 holds a substrate W.

The gas outlet 93 includes a plurality of first outlets 94, for example. The first outlets 94 are located outward of the second nozzle 45. The first outlets 94 are located more inward of the rotation axis A than the fixed pins 91. The first outlets 94 are arranged on a circumference about the rotation axis A in plan view.

The fixed pin 91 is one example of a supporting member in the present invention.

The treating unit 14 includes a first gas feed channel 96. The first gas feed channel 96 supplies gas to the first outlets 94. The first gas feed channel 96 is partially formed inside of the plate 32. The first gas feed channel 96 includes a first end and a second end. The first end of the first gas feed channel 96 is connected to a gas supplying source 98. The second end of the first gas feed channel 96 is connected to the first outlets 94. The gas supplied to the first outlets 94 is, for example, a nitrogen gas or air. The gas supplied to the first outlets 94 is, for example, a high-pressure gas or a compressed gas.

The treating unit 14 includes a blowout adjusting unit 101. The blowout adjusting unit 101 adjusts a flow rate of the gas blown from the gas outlet 93. Specifically, the blowout adjusting unit 101 is provided in the first gas feed channel 96. The blowout adjusting unit 101 adjusts a flow rate of the gas supplied to the first outlets 94.

In the present modification, the gas outlet 93 may further include second outlets arranged on the middle of the top face 32a of the plate 32. The blowout adjusting unit 101 may adjust the flow rate of the gas blown from the first outlets 94 and the flow rate of the gas blown from the second outlets individually.

In the present modification, the gas outlet 93 may also blow gas upward through the second nozzle 45. The blowout adjusting unit 101 may adjust the flow rate of the gas blown through the first outlets 94 and the flow rate of the gas blown from the second nozzle 45 individually.

In the first, second, and third embodiments, the treatment liquid supplying unit 41 supplies the treatment liquid on the upper face of the substrate W. However, the present invention is not limited to this. The treatment liquid supplying unit 41 may not supply the treatment liquid to the upper face of the substrate W. The treatment liquid supplying unit 41 may supply the treatment liquid to only the lower face of the substrate W. In the present modifications, the controller 18 may not change the upper height position HT and may change only the lower height position HB.

In the first, second, and third embodiments, the treatment liquid supplying unit 41 supplies the treatment liquid to the lower face of the substrate W. However, the present invention is not limited to this. The treatment liquid supplying unit 41 may not supply the treatment liquid to the lower face of the substrate W. The treatment liquid supplying unit 41 may supply the treatment liquid to only the upper face of the substrate W. In the present modifications, the controller 18 may not change the lower height position HB and may change only the upper height position HT.

In the first embodiment described above, the controller 18 selects either the first upper set value VTa or the second upper set value VTb. However, the present invention is not limited to this. For example, the memory unit 18a may store a first treatment recipe containing the first upper set value VTa and a second treatment recipe containing the second upper set value VTb. In the present modification, the controller 18 may select either the first treatment recipe or the second treatment recipe. Also with the present modification, the controller 18 can determine the upper height position HT suitably. Similarly, also in the second and third embodiments, the controller 18 may select one from a plurality of treatment recipes stored in the memory unit 18a.

In the first, second, and third embodiments described above, the controller 18 determines the shape of the substrate W in accordance with the detection results of the barcode readers 4 and the shape detectors 13 and 67. However, the present invention is not limited to this. For example, the controller 18 may determine the shape of the substrate W in accordance with the detection result of one of the barcode readers 4 and the shape detectors 13 and 67.

In the first, second, and third embodiments described above, the controller 18 determines the shape of the substrate W in accordance with the detection results of the barcode readers 4 and the shape detectors 13 and 67. However, the present invention is not limited to this. For example, the substrate treating apparatus 1 may include a substrate information detecting unit, not shown, configured to read substrate information affixed to the substrate W. In the present modification, the controller 18 may determine the shape of the substrate W in accordance with the detection result of the substrate information detecting unit. Here, substrate information affixed to the substrate W is, for example, an identification code printed on the substrate W. The substrate information detecting unit is, for example, a reader.

In the first, second, and third embodiments described above, the controller 18 may also obtain information from an external device of the substrate treating apparatus 1. The external device of the substrate treating apparatus 1 is, for example, a host computer. In the present modification, the controller 18 may transmit the detection result of the barcode reader 4 to the external device, for example, before the controller 18 obtains information from the external device. In the present modification, the controller 18 may transmit the detected results of the shape detectors 13 and 67 and the detection results of the presence/absence detectors 6 and 16, for example, to the external device before the controller 18 obtains information from the external device.

The following exemplarily describes information that the controller 18 obtains from the external device.

For example, the controller 18 may obtain information about the shape of the substrate W (hereinafter, referred to as substrate shape information) from the external device of the substrate treating apparatus 1. The controller 18 may identify the shape of the substrate W in accordance with the substrate shape information obtained from the external device.

The substrate shape information may be information that directly indicates the shape of the substrate W, for example. The information directly indicating the shape of the substrate W is, for example, information directly indicating at least one selected from a thickness of the main portion 23 of the substrate W, a depth D of the recess 24 of the substrate W, and an angle θ of the wall 26 of the substrate W. For example, the information directly indicating the shape of the substrate W may include information directly indicating whether the substrate W has the recess 24. For example, the information directly indicating the shape of the substrate W may include information directly indicating whether the recess 24 is formed on the upper face of the substrate W. For example, the information directly indicating the shape of the substrate W may include information directly indicating whether the recess 24 is formed on the lower face of the substrate W. When the controller 18 obtains the information that directly indicates the shape of the substrate W, the controller 18 does not perform a step for determining the shape of the substrate W (e.g., steps S2, S12, and S22).

The substrate shape information may be information that indirectly indicates the shape of the substrate W, for example. When the controller 18 obtains the information that indirectly indicates the shape of the substrate W, the controller 18 performs the step for determining the shape of the substrate W (e.g., steps S2, S12, and S22) in accordance with the information that indirectly indicates the shape of the substrate W.

For example, the controller 18 may obtain information about at least either the upper height position HT or the lower height position HB (hereinafter, referred to as liquid collecting condition information) from the external device of the substrate treating apparatus 1. Here, the liquid collecting condition information is set in accordance with the shape of the substrate W held by the substrate holder 31. The controller 18 may determine at least either the upper height position HT or the lower height position HB in accordance with the liquid collecting condition information obtained from the external device. Also with the present modification, the controller 18 can change at least either the upper height position HT or the lower height position HB in accordance with the shape of the substrate W held by the substrate holder 31. In the present modification, the controller 18 may not perform the step for determining the shape of the substrate W (e.g., steps S2, S12, and S22).

The liquid collecting condition information may be information that directly specifies at least either the upper height position HT or the lower height position HB.

The information directly specifying the upper height position HT may contain an upper set value, for example. When the liquid collecting condition information contains the upper set value, the upper set value contained in the liquid collecting condition information is determined by the controller 18. When the liquid collecting condition information contains the upper set value, the controller 18 changes the upper height position HT in accordance with the upper set value contained in the liquid collecting condition information.

The information directly specifying the lower height position HB may contain a lower set value, for example. When the liquid collecting condition information contains the lower set value, the lower set value contained in the liquid collecting condition information is determined by the controller 18. When the liquid collecting condition information contains the lower set value, the controller 18 changes the lower height position HB in accordance with the lower set value contained in the liquid collecting condition information.

The liquid collecting condition information may be information that indirectly specifies at least either the upper height position HT or the lower height position HB.

The information indirectly specifying the upper height position HT may contain upper set value identification information for identifying the upper set value, for example. In the present modification, the memory unit 18a stores a plurality of upper set values. Then, the controller 18 identifies an upper set value, specified by the upper set value identification information, among the upper set values stored in the memory unit 18a. Then, the identified upper set value is determined by the controller 18. The controller 18 changes the upper height position HT in accordance with the identified upper set value.

The information indirectly specifying the upper height position HT may contain recipe identification information for identifying the treatment recipe, for example. In the present modification, the memory unit 18a stores a plurality of treatment recipes. Then, the controller 18 identifies a treatment recipe, specified by the recipe identification information, among the treatment recipes stored in the memory unit 18a. Then, the upper set value contained in the identified treatment recipe is determined by the controller 18. The controller 18 changes the upper height position HT in accordance with the determined upper set value.

The information indirectly specifying the lower height position HT may contain lower set value identification information for identifying the lower set value, for example. In the present modification, the memory unit 18a stores a plurality of lower set values. Then, the controller 18 identifies a lower set value, specified by the lower set value identification information, among the lower set values stored in the memory unit 18a. Then, the identified lower set value is determined by the controller 18. The controller 18 changes the lower height position HB in accordance with the identified lower set value.

The information indirectly specifying the lower height position HB may contain recipe identification information for identifying the treatment recipe, for example. In the present modification, the memory unit 18a stores a plurality of treatment recipes. Then, the controller 18 identifies a treatment recipe, specified by the recipe identification information, among the treatment recipes stored in the memory unit 18a. Then, the lower set value contained in the identified treatment recipe is determined by the controller 18. The controller 18 changes the lower height position HB in accordance with the determined lower set value.

In the first, second, and third embodiments described above, the controller 18 may also obtain information from the input unit 17. For example, a user may input substrate shape information to the input unit 17. The controller 18 may identify the shape of the substrate W in accordance with the substrate shape information inputted to the input unit 17. The substrate shape information inputted to the input unit 17 may be information that directly indicates the shape of the substrate W, for example. The substrate shape information inputted to the input unit 17 may be information that indirectly indicates the shape of the substrate W, for example.

For example, a user may input liquid collecting condition information to the input unit 17. Here, the liquid collecting condition information inputted to the input unit 17 is set in accordance with the shape of the substrate W held by the substrate holder 31. The controller 18 may determine at least either the upper height position HT or the lower height position HB in accordance with the liquid collecting condition information inputted to the input unit 17. The liquid collecting condition information inputted to the input unit 17 may be information directly specifying at least either the upper height position HT or the lower height position HB, for example. The liquid collecting condition information inputted to the input unit 17 may be information indirectly specifying at least either the upper height position HT or the lower height position HB, for example. Also with the present modification, the controller 18 can change at least either the upper height position HT or the lower height position HB in accordance with the shape of the substrate W held by the substrate holder 31. In the present modification, the controller 18 may not perform the step for determining the shape of the substrate W (e.g., steps S2, S12, and S22).

In the first, second, and third embodiments, the number of first nozzles 42 of the treatment liquid supplying unit 41 is one. However, the present invention is not limited to this. The number of first nozzles 42 of the treatment liquid supplying unit 41 may be two or more.

In the first, second, and third embodiments, the number of second nozzles 45 of the treatment liquid supplying unit 41 is one. However, the present invention is not limited to this. The number of second nozzles 45 of the treatment liquid supplying unit 41 may be two or more.

In the first and second embodiments, the first guard 51 and the second guard 52 are not connected to the cup 59. However, the present invention is not limited to this. Either the first guard 51 or the second guard 52 may be connected to the cup 59. Either the first guard 51 or the second guard 52 may be formed integrally with the cup 59. Either the first guard 51 or the second guard 52 may be inseparable from the cup 59.

In the embodiments described above, the number of transport mechanisms 15 provided in the treating block 11 is one. However, the invention is not limited to this. Two or more transport mechanisms 15 may be provided in the treating block 11. The number of treating units 14 may be increased in accordance with the number of the transport mechanisms 15 in the treating block 11.

The embodiments and the modifications described above may be variable appropriately by replacing or combining constructions of the present embodiments with other thereof.

REFERENCE SIGNS LIST

1 . . . substrate treating apparatus
2 . . . indexer
3 . . . carrier platform
4 . . . barcode reader
5 . . . transport mechanism
11 . . . treating block
12 . . . mount table
13 . . . shape detector
14 . . . treating unit
15 . . . transport mechanism
17 . . . input unit
18 . . . controller
18a . . . memory unit
18b . . . setting unit
18c . . . drive circuit
21 . . . substrate body
22 . . . peripheral portion
23 . . . main portion
24 . . . recess
24A . . . upper recess portion
24B . . . lower recess portion
25 . . . protective plate
26 . . . wall
31 . . . substrate holder
32 . . . plate
32a . . . top face
33 . . . edge contact pin
35 . . . rotation driving unit
41 . . . treatment liquid supplying unit
42 . . . first nozzle
45 . . . second nozzle
48 . . . flow rate adjusting unit
50 . . . liquid collecting unit 51 . . . first guard (guard)
52 . . . second guard (guard)
53 . . . vertical portion
54 . . . slope portion
54A . . . upper edge
55 . . . vertical portion
56 . . . slope portion
56A . . . upper edge
57, 57a, 57b, 57c, 57d . . . collecting space
58, 58a, 58b, 58c, 58d . . . liquid inlet
58T, 58Ta, 58Tb, 58Tc, 58Td . . . upper end
58B, 58Ba, 58Bb, 58Bc . . . lower end
59 . . . cup
59a . . . groove
60 . . . guard driving unit
61 . . . guard drive mechanism (first guard driving unit)
62 . . . guard drive mechanism (second guard driving unit)
63 . . . third guard drive mechanism
64 . . . fourth guard drive mechanism
67 . . . shape detector
81 . . . third guard (guard)
82 . . . fourth guard (guard)
83 . . . vertical portion
84 . . . slope portion
84A . . . upper edge
85 . . . vertical portion
86 . . . slope portion
86A . . . upper edge
91 . . . fixed pin (supporting member)
93 . . . gas outlet
94 . . . first outlet
101 . . . blowout adjusting unit
A . . . rotation axis
C . . . carrier
D . . . depth of main portion relative to peripheral portion (depth of recess)
HT . . . upper height position (height position of upper end of liquid inlet)
HTa, HTc, HTe . . . first upper height position
HTb, HTd, HTf . . . second upper height position
HTg . . . third upper height position
HB . . . lower height position (height position of lower end of liquid inlet)
HBa . . . first lower height position
HBb . . . second lower height position
TA1 . . . thickness of main portion of A-type substrate
TB1 . . . thickness of main portion of B-type substrate
TC1 . . . thickness of main portion of C-type substrate
VTa, VTc, VTe . . . first upper set value (set value)
VTb, VTd, VTf . . . second upper set value (set value)
VTg . . . third upper set value (set value)
VBa . . . first lower set value (set value)
VBb . . . second lower set value (set value)
W . . . substrate
W1 . . . first substrate
W2 . . . second substrate
WA . . . A-type substrate
WB B-type substrate
WC . . . C-type substrate
Wp . . . thin substrate
Wq . . . thick substrate
θ . . . angle of wall

The invention claimed is:

1. A substrate treating apparatus, comprising:
a treating unit configured to treat a substrate; and
a controller configured to control the treating unit,
the treating unit including:
a substrate holder configured to hold the substrate in a horizontal posture;
a rotation driving unit configured to rotate the substrate holder;
a treatment liquid supplying unit configured to supply a treatment liquid to the substrate held by the substrate holder;
a liquid collecting unit including two or more guards located so as to surround the substrate holder laterally, and a liquid inlet defined by the guards and open toward the substrate held by the substrate holder; and
a guard driving unit configured to move at least one or more of the guards in a vertical direction,
the controller controlling the guard driving unit in accordance with a shape of the substrate held by the substrate holder, thereby changing at least either a height position of an upper end of the liquid inlet or a height position of a lower end of the liquid inlet.

2. The substrate treating apparatus according to claim 1, wherein
the controller changes the height position of the upper end of the liquid inlet in accordance with a thickness of a main portion of the substrate, the main portion located inward of a peripheral portion of the substrate.

3. The substrate treating apparatus according to claim 2, wherein
the upper end of the liquid inlet when the main portion of the substrate held by the substrate holder has a first thickness is higher than the upper end of the liquid inlet when the main portion of the substrate held by the substrate holder has a second thickness larger than the first thickness.

4. The substrate treating apparatus according to claim 1, wherein
the substrate includes
a first substrate that has a recess formed by a main portion of the substrate, located inward of a peripheral portion of the substrate, being recessed than the peripheral portion of the substrate, and
a second substrate that does not have the recess, and
the controller changes the height position of the upper end of the liquid inlet depending on whether the substrate held by the substrate holder is the first substrate or the second substrate.

5. The substrate treating apparatus according to claim 4, wherein
the upper end of the liquid inlet when the first substrate is held by the substrate holder is higher than the upper end of the liquid inlet when the second substrate is held by the substrate holder.

6. The substrate treating apparatus according to claim 1, wherein
the controller changes the height position of the upper end of the liquid inlet in accordance with whether the substrate held by the substrate holder has an upper recess portion formed on an upper face of the substrate by a main portion of the substrate, located inward of a peripheral portion of the substrate, being recessed than the peripheral portion of the substrate and whether the treatment liquid supplying unit supplies the treatment liquid to the upper face of the substrate held by the substrate holder.

7. The substrate treating apparatus according to claim 6, wherein
the upper end of the liquid inlet when the substrate held by the substrate holder has the upper recess portion and when the treatment liquid supplying unit supplies the treatment liquid to the upper face of the substrate held by the substrate holder is higher than the upper end of the liquid inlet when the substrate held by the substrate holder does not have the upper recess portion, and the upper end of the liquid inlet when the substrate held by the substrate holder has the upper recess portion and when the treatment liquid supplying unit supplies the treatment liquid to the upper face of the substrate is higher than the upper end of the liquid inlet when the treatment liquid supplying unit does not supply the treatment liquid to the upper face of the substrate held by the substrate holder.

8. The substrate treating apparatus according to claim 6, wherein the upper end of the liquid inlet when the treatment liquid supplying unit does not supply the treatment liquid to the upper face of the substrate held by the substrate holder is lower than the upper end of the liquid inlet when the treatment liquid supplying unit supplies the treatment liquid to the upper face of the substrate held by the substrate holder.

9. The substrate treating apparatus according to claim 6, wherein the controller changes the height position of the lower end of the liquid inlet in accordance with whether the substrate held by the substrate holder has a lower recess portion formed on a lower face of the substrate by the main portion of the substrate, located inward of the peripheral portion of the substrate, being recessed than the peripheral portion of the substrate and whether the treatment liquid supplying unit supplies the treatment liquid to the lower face of the substrate held by the substrate holder.

10. The substrate treating apparatus according to claim 9, wherein the lower end of the liquid inlet when the substrate held by the substrate holder has the lower recess portion and when the treatment liquid supplying unit supplies the treatment liquid to the lower face of the substrate held by the substrate holder is lower than the lower end of the liquid inlet when the substrate held by the substrate holder does not have the lower recess portion, and the lower end of the liquid inlet when the substrate held by the substrate holder has the lower recess portion and when the treatment liquid supplying unit supplies the treatment liquid to the lower face of the substrate held by the substrate holder is lower than the lower end of the liquid inlet when the treatment liquid supplying unit does not supply the treatment liquid to the lower face of the substrate held by the substrate holder.

11. The substrate treating apparatus according to claim 1, wherein the substrate has a recess formed by a main portion of the substrate, located inward of a peripheral portion of the substrate, being recessed than the peripheral portion of the substrate, and the controller changes at least either the height position of the upper end of the liquid inlet or the height position of the lower end of the liquid inlet in accordance with a depth of the main portion of the substrate relative to the peripheral portion of the substrate.

12. The substrate treating apparatus according to claim 1, wherein the substrate includes:
    a recess formed by a main portion of the substrate, located inward of a peripheral portion of the substrate, being recessed than the peripheral portion of the substrate, and
    a wall formed between the peripheral portion of the substrate and the main portion of the substrate, and the controller changes at least either the height position of the upper end of the liquid inlet or the height position of the lower end of the liquid inlet in accordance with an angle of the wall.

13. The substrate treating apparatus according to claim 1, wherein the substrate holder includes:
    a plate;
    a supporting member protruding upward from a top face of the plate, and contacting a lower face of the substrate to support the substrate at a position higher than the top face of the plate; and
    a gas outlet formed on the top face of the plate, and configured to blow a gas between the top face of the plate and the lower face of the substrate supported by the supporting member, and to suck the substrate downward.

14. The substrate treating apparatus according to claim 1, wherein the controller includes:
    a memory unit configured to store a plurality of set values about at least either the height position of the upper end of the liquid inlet or the height position of the lower end of the liquid inlet, and
    a setting unit configured to switch among the set values stored in the memory unit in accordance with the shape of the substrate held by the substrate holder.

* * * * *